US012336136B2

(12) United States Patent
Tunks et al.

(10) Patent No.: US 12,336,136 B2
(45) Date of Patent: Jun. 17, 2025

(54) MULTI-DEVICE CHASSIS AIR FILTER CHARACTERIZATION SYSTEM

(71) Applicant: Dell Products L.P., Round Rock, TX (US)

(72) Inventors: Eric Michael Tunks, Austin, TX (US); Michael Albert Perks, Austin, TX (US); Donald W. Gerhart, Leander, TX (US); John R. Stuewe, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 666 days.

(21) Appl. No.: 17/720,488

(22) Filed: Apr. 14, 2022

(65) Prior Publication Data

US 2023/0337392 A1    Oct. 19, 2023

(51) Int. Cl.
*H05K 7/20* (2006.01)
*G06F 1/18* (2006.01)
*G06F 1/20* (2006.01)
*H05K 7/14* (2006.01)

(52) U.S. Cl.
CPC ......... *H05K 7/20181* (2013.01); *G06F 1/181* (2013.01); *G06F 1/20* (2013.01); *H05K 7/1485* (2013.01)

(58) Field of Classification Search
CPC ........................................................ G06F 1/20
USPC .................................. 454/184; 361/600–831
See application file for complete search history.

(56) References Cited

U.S. PATENT DOCUMENTS

2019/0124795 A1*   4/2019   Dayal ................ H05K 7/20736

* cited by examiner

*Primary Examiner* — Ko-Wei Lin
(74) *Attorney, Agent, or Firm* — Joseph Mencher

(57) ABSTRACT

A multi-device chassis air filter characterization system includes a multi-device chassis, an air filter that is included on the multi-device chassis, and a plurality of computing devices that are housed in the multi-device chassis. Each of the computing devices determines that a current time corresponds to a predetermined air filter characterization time period and, in response, operates a cooling system in that computing device at a predetermined cooling system operating level for the predetermined air filter characterization time period. A first computing device that is included in the plurality of computing devices measures an air filtering characteristic provided by the air filter during the predetermined air filter characterization time period and, based on the air filtering characteristic, determines whether to generate an air filter replacement alert.

20 Claims, 20 Drawing Sheets

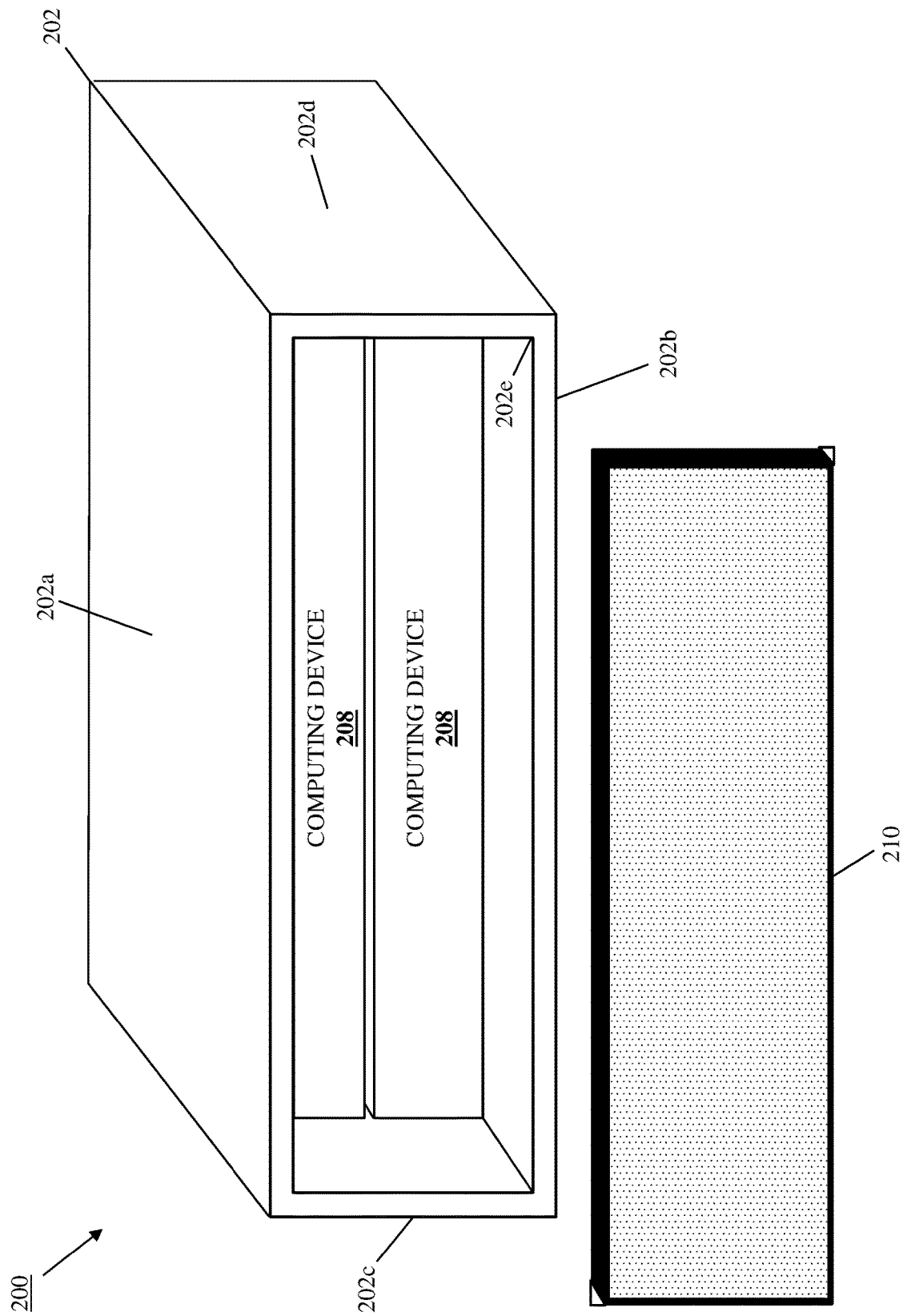

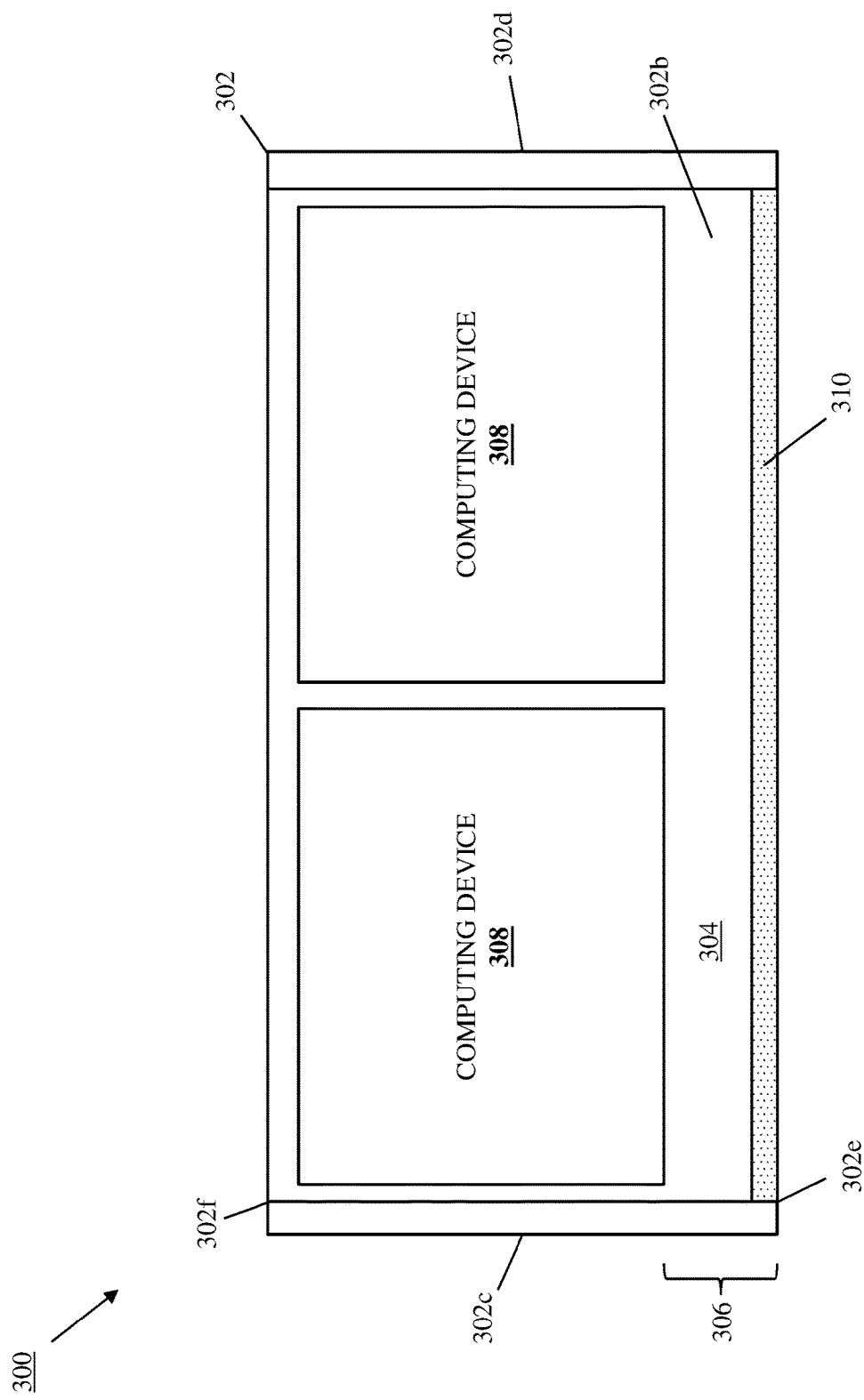

MULTI-DEVICE CHASSIS AIR FILTER CHARACTERIZATION SYSTEM

BACKGROUND

The present disclosure relates generally to information handling systems, and more particularly to characterizing air filters used in multi-device chassis that house multiple information handling systems to determine whether to replace those air filters.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as server devices and other computing devices known in the art often utilize cooling systems to dissipate heat generated by their components. Furthermore, air filters may be provided with cooling systems utilized with the computing devices discussed above and may operate to filter air used in the dissipation of heat generated by components in the computing device in order to, for example, prevent contaminants from entering the computing device. For example, computing devices positioned at the "edge" of a network (e.g., server devices utilized to provide wireless communications such as $5^{th}$ generation (5G) mobile network communications, as well as other edge computing devices known in the art) may be provided in multi-device chassis at locations with relatively low air quality as compared to, for example, datacenters that filter air that enters the datacenter before it reaches the multi-device chassis/computing devices included in that datacenter. As such, multi-device chassis may include the air filters discussed above in order to prevent contaminants in the air they receive from entering the computing devices housed therein and negatively effecting fan systems, heat sinks, computing device components, and/or other subsystems that would be apparent to one of skill in the art in possession of the present disclosure.

In conventional multi-device chassis, air filters may be characterized to determine whether those air filters should be replaced (e.g., due to the air filter having captured contaminants as a result of the operation of the cooling systems in the computing devices discussed above, often referred to as "clogging" of the filter). One conventional technique for characterizing air filters operates by measuring a differential pressure produced across the air filter to determine if that air filter is clogged. For example, when a "new"/"clean" air filter is provided on the multi-device chassis, a chassis manager system in the multi-device chassis may cause all of the computing devices in the multi-device chassis to run their fan systems, and a reference differential pressure produced across the air filter (e.g., a difference between a first pressure outside of the multi-device chassis, and a second pressure within the multi-device chassis) is measured and recorded. Then, some time period later, the chassis manager system in the multi-device chassis may again cause all of the computing devices in the multi-device chassis to run their fan systems, and a test differential pressure produced across the air filter is measured and recorded. In the event the test differential pressure exceeds the reference differential pressure by some predetermined amount, the air filter may be replaced. However, such conventional multi-device chassis air filter characterization techniques raise some issues.

For example, in order for the test differential pressure to provide a valid comparison to the reference differential pressure, the behavior of the fan systems in the computing devices in a multi-device chassis should be consistent when determining the reference differential pressure and the test differential pressure as discussed above. As such, continuing with the example provided above, the fan systems in the computing devices in a multi-device chassis should operate at the same fan speeds when determining the reference differential pressure and any subsequent test differential pressure. However, while some multi-device chassis include the multi-device chassis manager system discussed above that is configured to control the fan systems in each of the computing devices included in the multi-device chassis such that they may be run at the same fan speeds and thus provide the consistent fan system behavior that will result in a valid comparison of the reference differential pressure and the test differential pressure, other multi-device chassis may not include a multi-device chassis manager system or multi-device chassis manager capabilities discussed above that allow control of the fan systems in each of the computing devices included in the multi-device chassis. For example, some multi-device chassis house independent computing devices that each control the operation of each of their fan systems separately, and thus complicate determinations of the reference differential pressure and test differential pressures that may be validly compared as discussed above in order to accurately characterize the air filter on that multi-device chassis.

Accordingly, it would be desirable to provide a multi-device chassis air filter characterization system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide an air filter characterization engine that is configured to: determine that a current time corresponds to a predetermined air filter characterization time period; operate, in response to determining that the current time corresponds to the predetermined air filter characterization time period and at a predetermined cooling system operating level for the predetermined air filter characterization time period, a first cooling system that is included in a first Information Handling System (IHS) chassis with the processing system; measure, during the predetermined air filter characterization time period, an air filtering characteristic that is provided by an air filter on a multi-device chassis that houses the first IHS chassis in response to 1) the operation of the first cooling system at the predetermined cooling system operating level during the predetermined air filter characterization time period, and 2) operation of a respective second cooling system included in each of at least one second IHS chassis that is housed in the multi-device chassis at the predetermined cooling system operating level for the predetermined air filter characterization time period; and determine, based on the air filtering characteristic, whether to generate an air filter replacement alert.

BRIEF DESCRIPTION OF THE DRAWINGS

FIG. 2C is a perspective schematic view illustrating an embodiment of the multi-device chassis system of FIGS. 2A and 2B.

FIG. 3B is a cut-away top schematic view illustrating an embodiment of the multi-device chassis system of FIG. 3A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
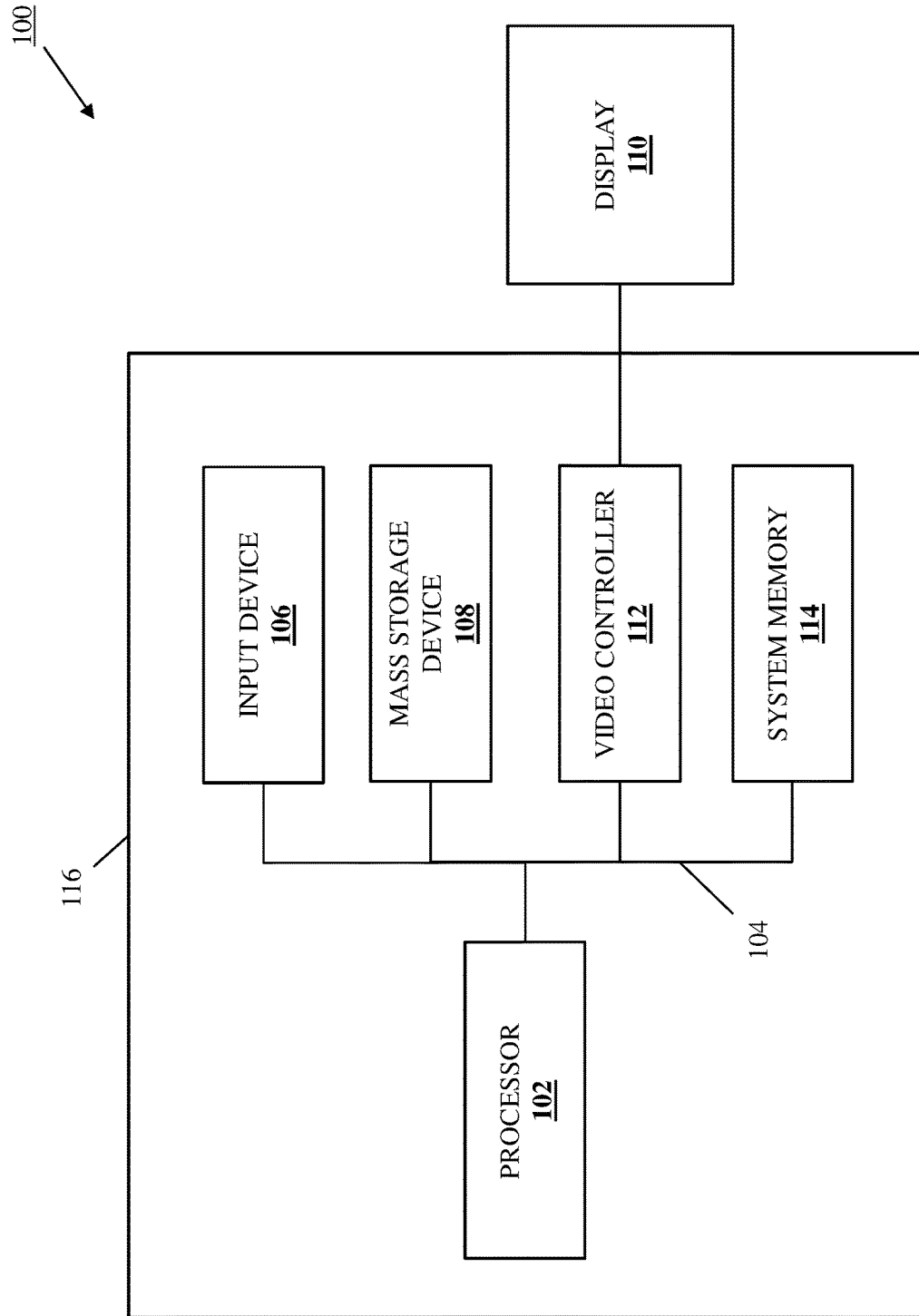
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
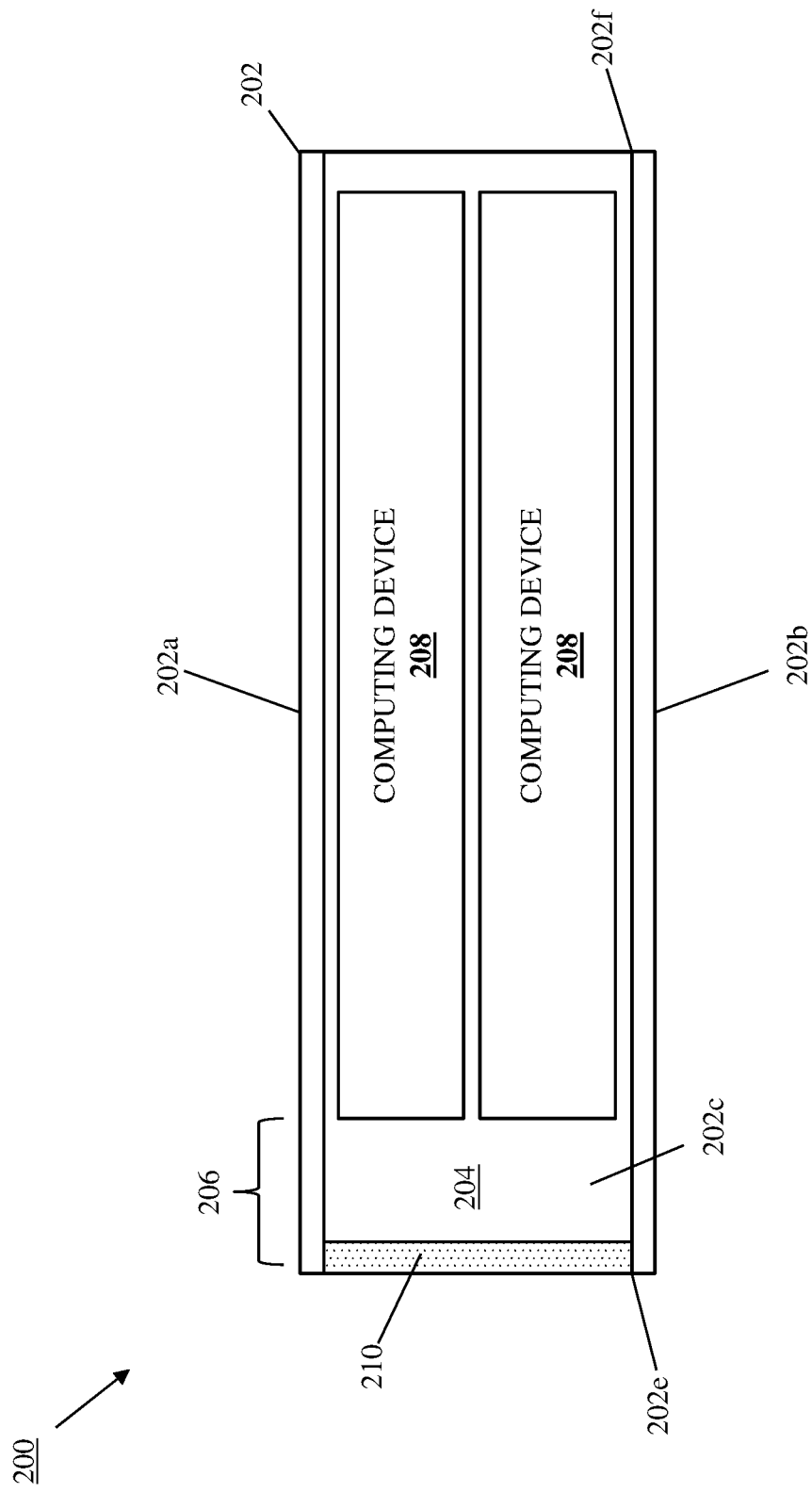
FIG. 2A is a cut-away side schematic view illustrating an embodiment of a multi-device chassis system that may include the multi-device chassis air filter characterization system of the present disclosure.
Figure 2B:
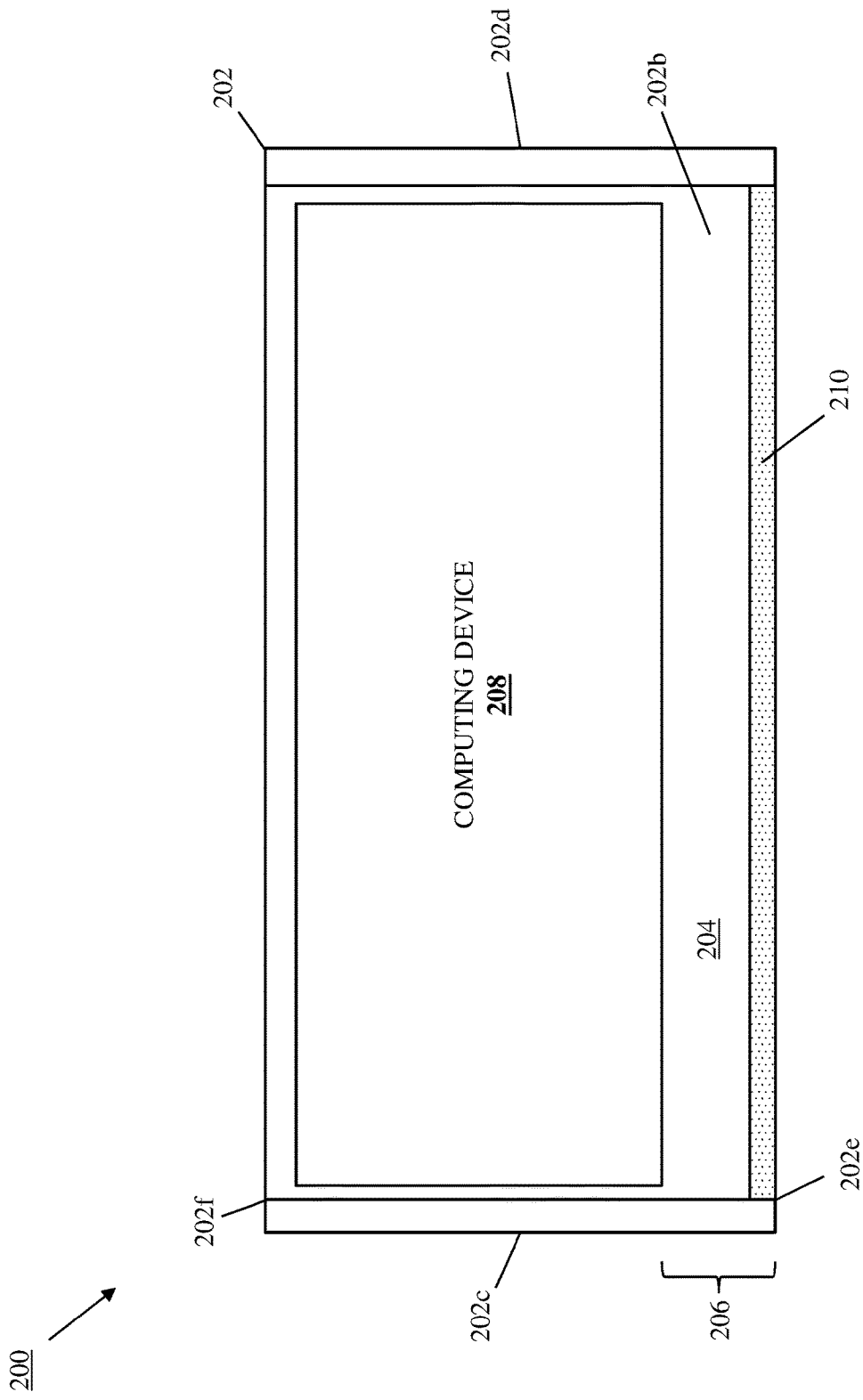
FIG. 2B is a cut-away top schematic view illustrating an embodiment of the multi-device chassis system of FIG. 2A.

Referring now to FIGS. 2A, 2B, and 2C, an embodiment of a multi-device chassis system 200 is illustrated that may include the multi-device chassis air filter characterization system of the present disclosure. In the illustrated embodiment, the multi-device chassis system 200 includes a multi-device chassis 202 having a top wall 202a, a bottom wall 202b that is located opposite the multi-device chassis 202 from the top wall 202a, and a pair of side walls 202c and 202d that extend between the top wall 202a and the bottom wall 202b and opposite each other on the multi-device chassis 202. As will be appreciated by one of skill in the art in possession of the present disclosure, the schematic view of FIG. 2A provides a cut-away side view in which the side wall 202d not visible, while the schematic view of FIG. 2B provides a cut-away top view in which the top wall 202a is not visible. In the illustrated embodiment, the multi-device chassis 202 defines an air inlet 202e between the top wall 202a, the bottom wall 202b, and the side walls 202c and 202d; and air outlet 202f between the top wall 202a, the bottom wall 202b, and the side walls 202c and 202d and opposite the multi-device chassis 202 form the air inlet 202e; and a multi-device chassis housing 204 between the air inlet 202e and the air outlet 202f.

In the illustrated embodiment, the multi-device chassis 202 includes a bezel 206 that is located on adjacent the air inlet 202e, and one of skill in the art in possession of the present disclosure will appreciate how air filter system coupling and/or securing features may be provided on the bezel 206. Furthermore, a plurality of computing devices 208 are positioned in the multi-device chassis housing 204, and one of skill in the art in possession of the present disclosure will how computing device mounting and/or securing features may be provided on the top wall 202a, the bottom wall 202b, and/or the side walls 202c and 202d of the multi-device chassis 202, as well as on intermediate walls (not illustrated) such as, for example, an intermediate wall located approximately midway between the top wall 202a and the bottom wall 202b and used to support the computing device 208 that is positioned immediately adjacent the top wall 202a in FIG. 2A.

In an embodiment, any or each of the computing devices 208 may be provided by the IHS 100 discussed above with reference to FIG. 1 and/or may include some or all of the components of the IHS 100, and in the specific examples below are described as being provide by server devices. However, while illustrated and discussed as being provided by server devices, one of skill in the art in possession of the present disclosure will recognize that the functionality of the server devices discussed below may be provided by other devices (e.g., networking devices, storage systems, etc.) that are configured to operate similarly as the computing device 208 discussed below. As will be appreciated by one of skill in the art in possession of the present disclosure, the multi-device chassis system 200 may be free of a chassis manager system and/or chassis manager functionality that, as discussed above, is typically utilized in conventional air filter characterization systems to control cooling systems in each of the computing devices 208, and each of the computing devices 208 may be considered "independent" computing devices that each control their respective cooling systems independent of each other.

In the illustrated embodiment, an air filter system 210 is coupled to the multi-device chassis 202 in (or adjacent) the air inlet 202e, and one of skill in the art in possession of the present disclosure will appreciate that, while not illustrated in the examples below, the air filter system 210 may include any of a variety of multi-device chassis coupling and/or securing features that operate to couple and/or secure the air filter system 210 to the multi-device chassis 202. Furthermore, one of skill in the art in possession of the present disclosure will appreciate how the air filter system 210 may include one or more air filters utilizing any of a variety of air filter materials known in the art. FIG. 2C illustrates a perspective schematic view in which the air filter 210 is removed from the multi-device chassis 202, and one of skill in the art in possession of the present disclosure will appreciate how the air filter 210 may be moved towards the multi-device chassis 202 in FIG. 2C in order to couple and/or secure the air filter system 210 to the multi-device chassis 202.

As will be appreciated by one of skill in the art in possession of the present disclosure, the multi-device chassis system 200 illustrated in FIGS. 2A, 2B, and 2C includes an example of a two-computing-device multi-device chassis. However, one of skill in the art in possession of the present disclosure will also appreciate how multi-device chassis provided according to the teachings of the present disclosure may house additional computing devices in a variety of different configurations while remaining within the scope of the present disclosure as well.

Figure 3A:
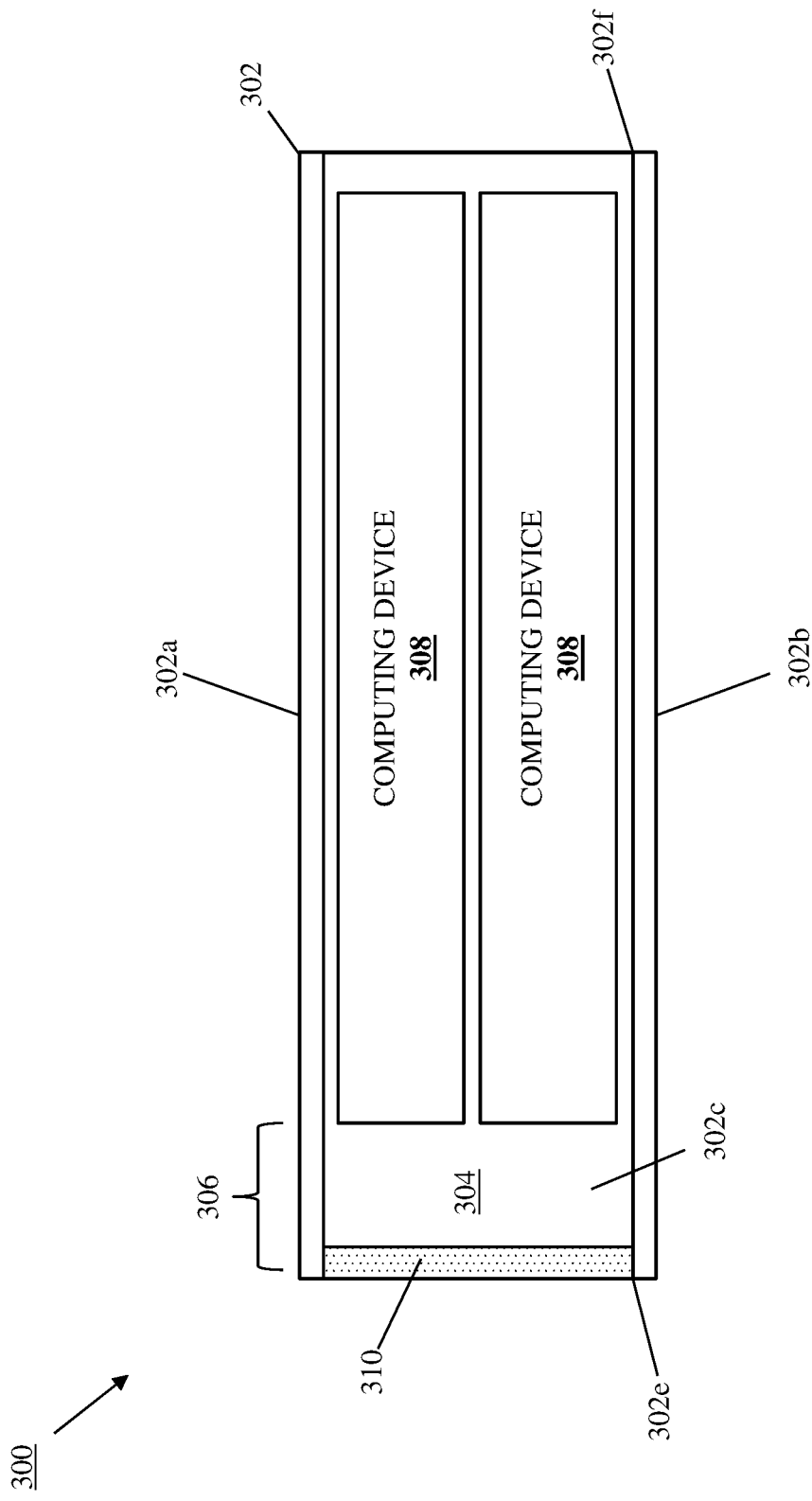
FIG. 3A is a cut-away side schematic view illustrating an embodiment of a multi-device chassis system that may include the multi-device chassis air filter characterization system of the present disclosure.
Figure 3C:
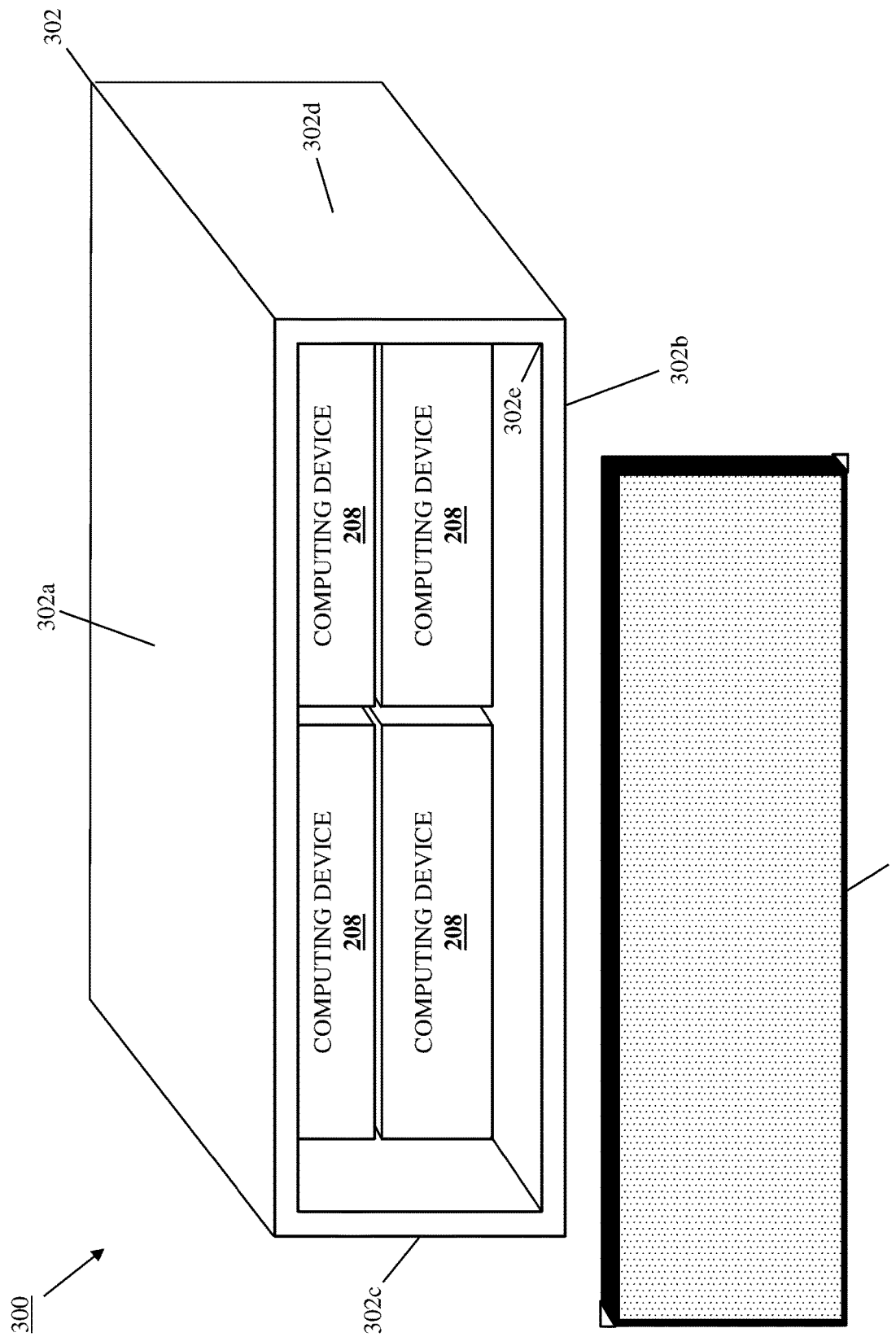
FIG. 3C is a perspective schematic view illustrating an embodiment of the multi-device chassis system of FIGS. 3A and 3B.

For example, FIGS. 3A, 3B, and 3C illustrate an embodiment of a multi-device chassis system 300 that may include the multi-device chassis air filter characterization system of the present disclosure, and that includes a multi-device chassis 302 that provides an example of a four-computing-device multi-device chassis. In the illustrated embodiment, the multi-device chassis 302 includes a top wall 302a, a bottom wall 302b that is located opposite the multi-device chassis 302 from the top wall 302a, and a pair of side walls 302c and 302d that extend between the top wall 302a and the bottom wall 302b and opposite each other on the multi-device chassis 302. As will be appreciated by one of skill in the art in possession of the present disclosure, the schematic view of FIG. 3A provides a cut-away side view in which the side wall 302d not visible, while the schematic view of FIG. 3B provides a cut-away top view in which the top wall 302a is not visible. In the illustrated embodiment, the multi-device chassis 302 defines an air inlet 302e between the top wall 302a, the bottom wall 302b, and the side walls 302c and 302d; and air outlet 302f between the top wall 302a, the bottom wall 302b, and the side walls 302c and 302d and opposite the multi-device chassis 302 form the air inlet 302e; and a multi-device chassis housing 304 between the air inlet 302e and the air outlet 302f.

In the illustrated embodiment, the multi-device chassis 302 includes a bezel 306 that is located on adjacent the air inlet 302e, and one of skill in the art in possession of the present disclosure will appreciate how air filter system coupling and/or securing features may be provided on the bezel 306. Furthermore, a plurality of computing devices 308 are positioned in the multi-device chassis housing 304, and one of skill in the art in possession of the present disclosure will appreciate how computing device mounting and/or securing features may be provided on the top wall 302a, the bottom wall 302b, and/or the side walls 302c and 302d of the multi-device chassis 302, as well as on intermediate walls (not illustrated) such as, for example, an intermediate wall located approximately midway between the top wall 302a and the bottom wall 302b and used to support the computing devices 308 that are positioned immediately adjacent the top wall 302a in FIG. 3A, and/or an intermediate wall located approximately midway between the side walls 302c and 302d and used to separate the respective computing devices 308 that are positioned immediately adjacent the side wall 302c and 302d, respectively, in FIG. 3B.

In an embodiment, any or each of the computing devices 308 may be provided by the IHS 100 discussed above with reference to FIG. 1 and/or may include some or all of the components of the IHS 100, and in the specific examples below are described as being provide by server devices. However, while illustrated and discussed as being provided by server devices, one of skill in the art in possession of the present disclosure will recognize that the functionality of the server devices discussed below may be provided by other devices (e.g., networking devices, storage systems, etc.) that are configured to operate similarly as the computing device 308 discussed below. As will be appreciated by one of skill in the art in possession of the present disclosure, the multi-device chassis system 300 may be free of a chassis manager system and/or chassis manager functionality that, as discussed above, is typically utilized in conventional air filter characterization systems to control cooling systems in each of the computing devices 308, and each of the computing devices 308 may be considered "independent" computing devices that each control their respective cooling systems independent of each other.

In the illustrated embodiment, an air filter system 310 is coupled to the multi-device chassis 302 in (or adjacent) the air inlet 302*e*, and one of skill in the art in possession of the present disclosure will appreciate that, while not illustrated in the examples below, the air filter system 310 may include any of a variety of multi-device chassis coupling and/or securing features that operate to couple and/or secure the air filter system 310 to the multi-device chassis 302. Furthermore, one of skill in the art in possession of the present disclosure will appreciate how the air filter system 310 may include one or more air filters utilizing any of a variety of air filter materials known in the art. FIG. 3C illustrates a perspective schematic view in which the air filter 310 is removed from the multi-device chassis 302, and one of skill in the art in possession of the present disclosure will appreciate how the air filter 310 may be moved towards the multi-device chassis 302 in FIG. 3C in order to couple and/or secure the air filter system 310 to the multi-device chassis 302. However, while two particular multi-device chassis system configurations are illustrated and described herein, one of skill in the art in possession of the present disclosure will appreciate how other multi-device chassis system configurations will benefit from the teachings of the present disclosure and thus will fall within its scope as well.

Figure 4:
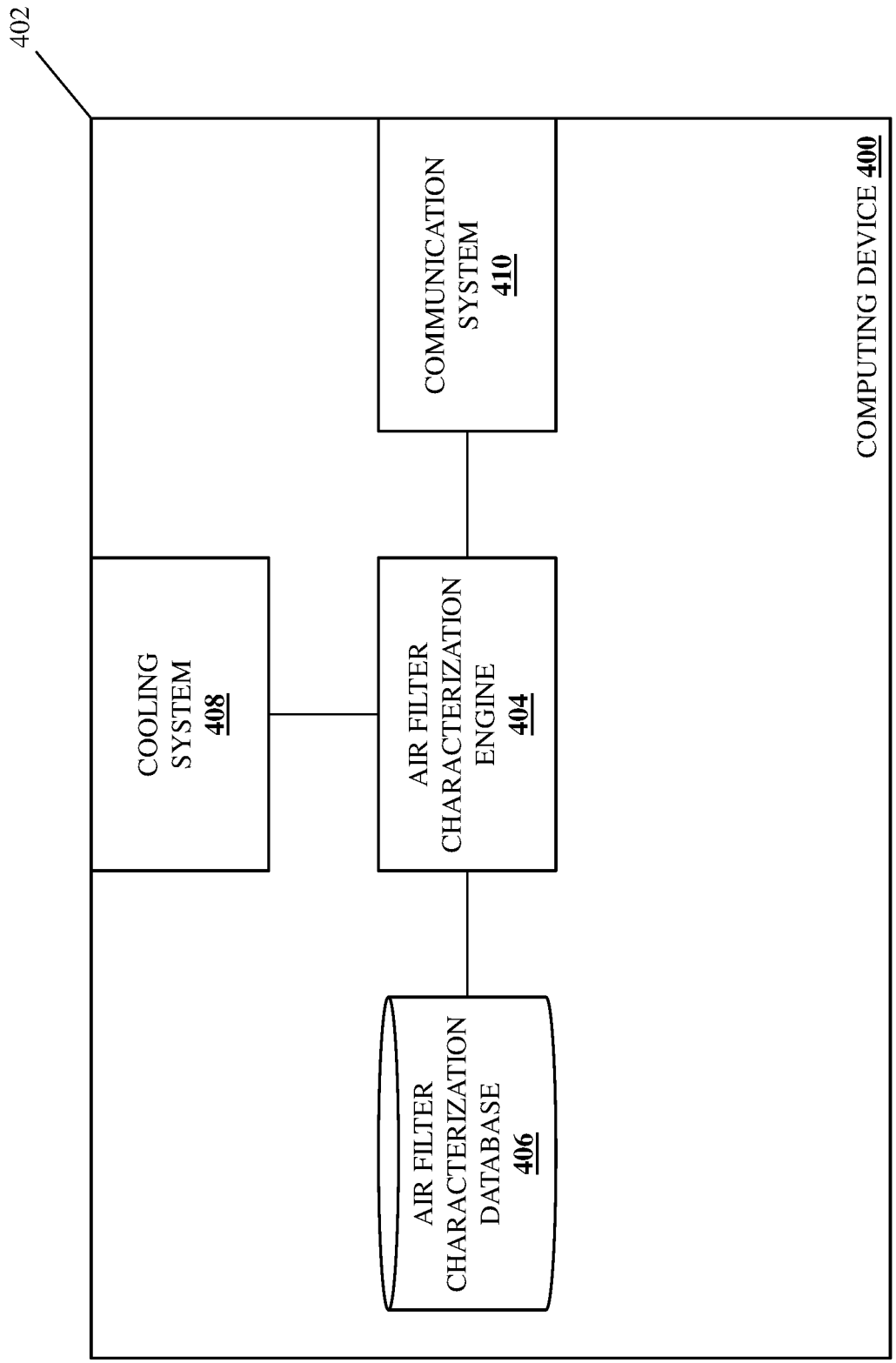
FIG. 4 is a schematic view illustrating an embodiment of a computing device that may be provided in the multi-device chassis of FIGS. 2A and 2B, or 3A and 3B.

Referring now to FIG. 4, an embodiment of a computing device 400 is illustrated that may provide any of the computing devices 208 and/or 308 discussed above with reference to FIGS. 2A and 2B, and 3A and 3B. As such, the computing device 400 may be provided by the IHS 100 discussed above with reference to FIG. 1 and/or may include some or all of the components of the IHS 100, and in the specific examples below is illustrated and described as being provided by a server device. However, while illustrated and discussed being provided by a server device, one of skill in the art in possession of the present disclosure will recognize that the functionality of the computing device 400 discussed below may be provided by other devices (e.g., networking devices, storage systems, etc.) that are configured to operate similarly as the computing device discussed below. In the illustrated embodiment, the computing device 400 includes a chassis 402 that houses the components of the computing device 400, only some of which are illustrated and discussed below. For example, the chassis 402 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide an air filter characterization engine 404 that is configured to perform the functionality of the air filter characterization engines and/or computing devices discussed below.

The chassis 402 may also house a storage system (not illustrated, but which may include the storage 108 discussed above with reference to FIG. 1) that is coupled to the air filter characterization engine 404 (e.g., via a coupling between the storage system and the processing system) and that includes an air filter characterization database 406 that is configured to store any of the information utilized by the air filter characterization engine 404 discussed below. The chassis 402 may also house a cooling system 408 that, in the specific example provided below, includes a fan system with one or more fan devices, but that one of skill in the art in possession of the present disclosure will appreciate may include any of a variety of air moving devices (e.g., air blowers, etc.) while remaining within the scope of the present disclosure as well.

The chassis 402 may also house a communication system 410 that is coupled to the air filter characterization engine 404 (e.g., via a coupling between the communication system 410 and the processing system) and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure. However, while a specific computing device 400 has been illustrated and described, one of skill in the art in possession of the present disclosure will recognize that computing devices (or other devices operating according to the teachings of the present disclosure in a manner similar to that described below for the computing device 400) may include a variety of components and/or component configurations for providing conventional computing device functionality, as well as the functionality discussed below, while remaining within the scope of the present disclosure as well.

Figure 5:
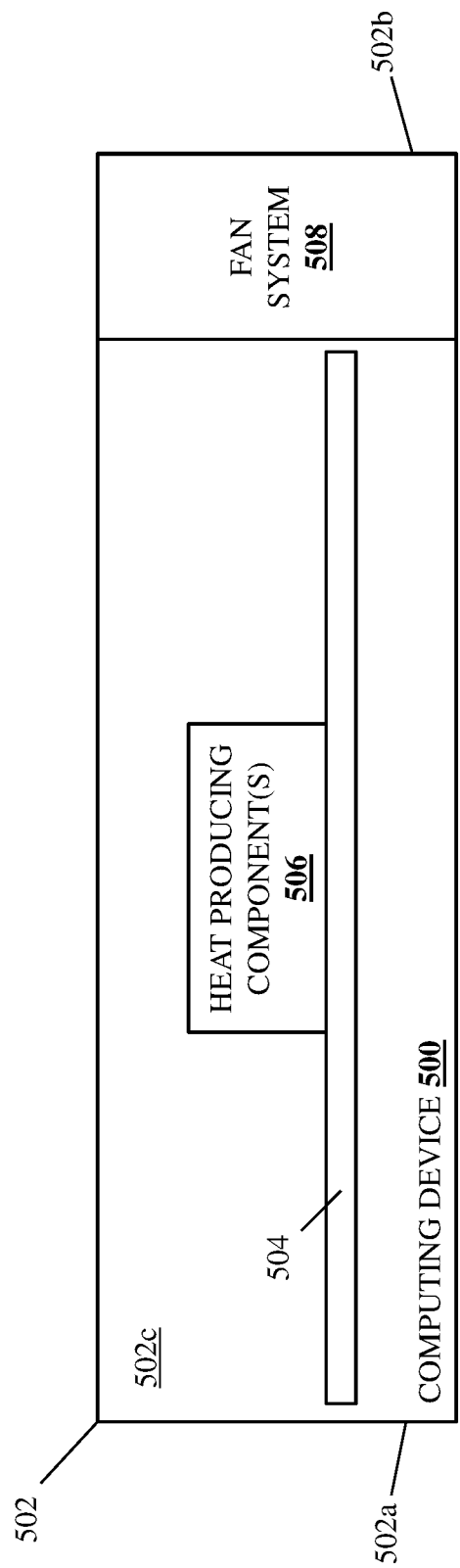
FIG. 5 is a schematic view illustrating an embodiment of a computing device that may provided the computing device of FIG. 4.

Referring now to FIG. 5, an embodiment of a computing device 500 is illustrated that may provide any of the computing devices 208, 308, and 400 and discussed above with reference to FIGS. 2A and 2B, 3A and 3B, and 4, and that is utilized in the specific examples provided below to provide an example of the operation of computing devices in the multi-device chassis air filter characterization system of the present disclosure. In the illustrated embodiment, the computing device 500 includes a chassis 502 having a front surface 502*a* and a rear surface 502*b* that is located opposite the chassis 502 from the front surface 502*a*, and defines a computing device housing 502*c* that houses the components of the computing device 500, only some of which are illustrated and described below. For example, a board 504 (e.g., a motherboard) may be positioned in the computing device housing 502*c* and housed in the chassis 502, and may include one or more heat producing components 506 (e.g., the processing systems, memory systems, communication systems, etc., discussed above) mounted to and/or coupled to the board 504.

Furthermore, a fan system 508 is positioned in the computing device housing 502*c* and housed in the chassis 502 adjacent the rear surface 502*b*, and one of skill in the art in possession of the present disclosure will appreciate how the front surface 502*a* and the rear surface 502 of the chassis 502 may define air apertures and/or other airflow features that allow airflow to enter the computing device housing 502*c* via the front surface 502*a* and exit the chassis 502 via the rear surface 502*b* in response to operation of the fan system 508. Furthermore, while the fan system 508 is illustrated and described as being located immediately adjacent the rear surface 502b of the chassis 502, one of skill in the art in possession of the present disclosure will appreciate how the fan system 508 may include fan device(s) adjacent the front surface 502a of the chassis 502, fan device(s) adjacent the rear surface 502b of the chassis 502, and/or fan device(s) positioned anywhere within the computing device housing 502c, while remaining within the scope of the present disclosure.

Figure 6:
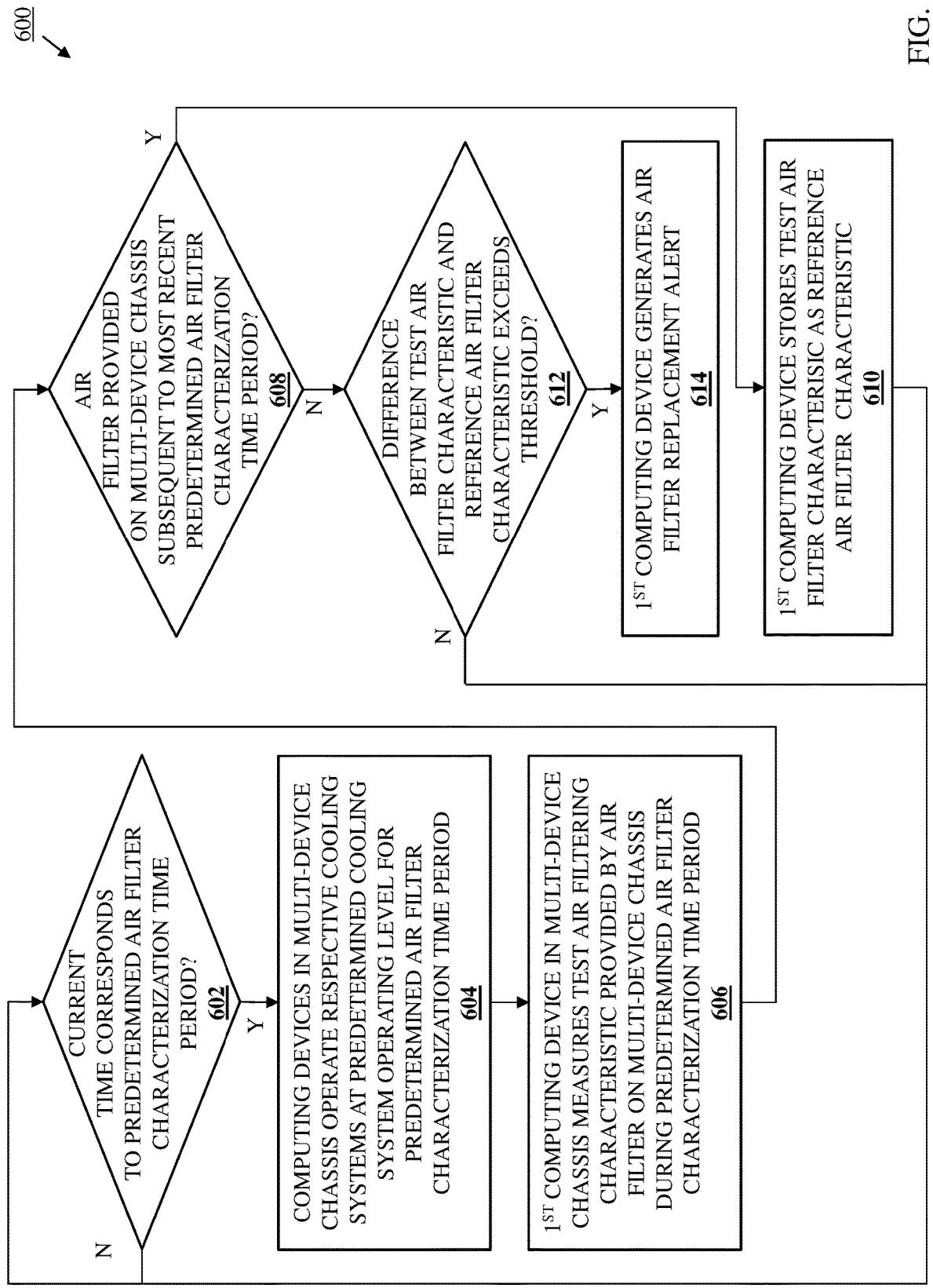
FIG. 6 is a flow chart illustrating an embodiment of a method for multi-device chassis air filter characterization.

Referring now to FIG. 6, an embodiment of a method 600 for multi-device chassis air filter characterization is illustrated. As discussed below, the systems and methods of the present disclosure provide for the coordination of the operation of cooling systems in independent computing devices that share a multi-device chassis at a predetermined operating level during a predetermined air filter characterization period so that one of the computing devices may measure air filtering characteristics provided by an air filter on the multi-device chassis in order to determine whether that air filter should be replaced. For example, the multi-device chassis air filter characterization system of the present disclosure may include a multi-device chassis, an air filter that is included on the multi-device chassis, and a plurality of computing devices that are housed in the multi-device chassis. Each of the computing devices determines that a current time corresponds to a predetermined air filter characterization time period and, in response, operates a cooling system in that computing device at a predetermined cooling system operating level for the predetermined air filter characterization time period. A first computing device that is included in the plurality of computing devices measures an air filtering characteristic provided by the air filter during the predetermined air filter characterization time period and, based on the air filtering characteristic, determines whether to generate an air filter replacement alert. As such, accurate determinations of a reference air filtering characteristic and test air filtering characteristics may be made in order to allow accurate characterization of an air filter on a multi-device chassis that houses independent computing devices, which each control the operation of each of their cooling systems separately, in order to determine whether that air filter should be replaced.

Figure 7:
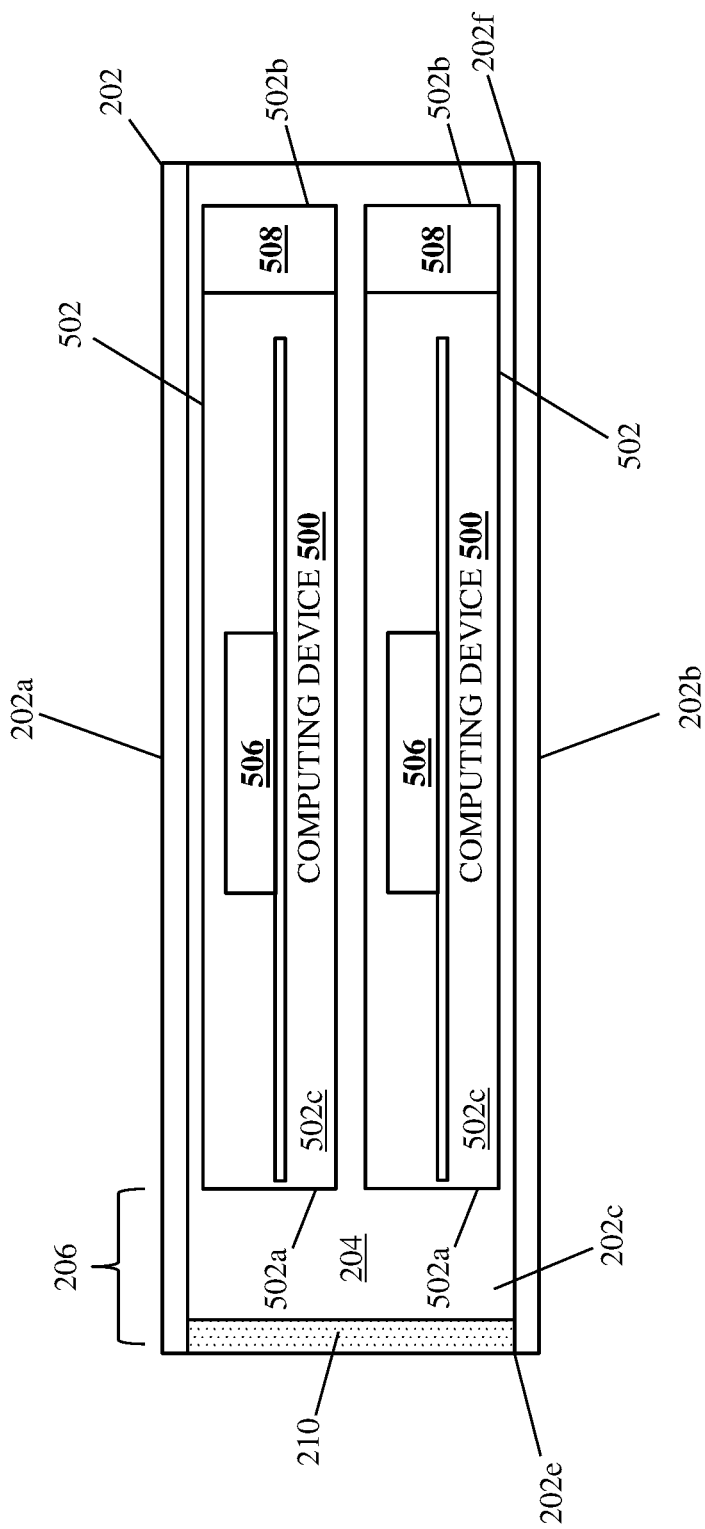
FIG. 7 is a schematic view illustrating an embodiment of a plurality of the computing device of FIG. 5 in the multi-device chassis of FIG. 2 during the method of FIG. 6.
Figure 8:
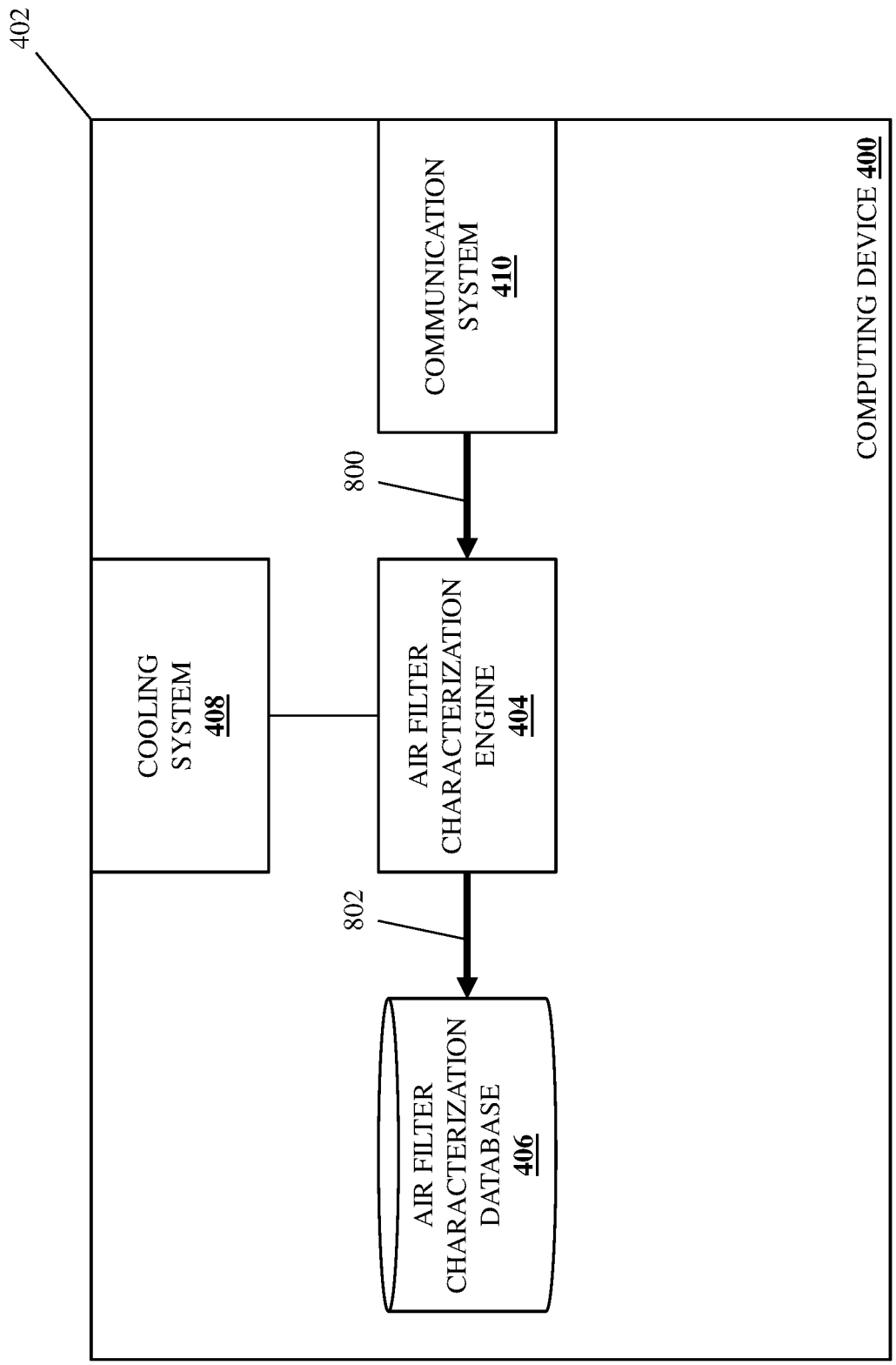
FIG. 8 is a schematic view illustrating an embodiment of the operation of the computing device of FIG. 4 during the method of FIG. 6.

The method 600 begins at decision block 602 where computing devices in a multi-device chassis determine whether a current time corresponds to a predetermined air filter characterization time period. With reference to FIG. 7, the computing device 500 of FIG. 5 is illustrated as being provided as each of the computing devices 208 in the multi-device chassis system 200 of FIGS. 2A and 2B, but one of skill in the art in possession of the present disclosure will appreciate how the computing devices 308 in the multi-device chassis system 300 of FIGS. 3A and 3B may operate in a similar manner to that described below. In an embodiment, during or prior to the method 600, respective clocks in each of the computing devices 500 in the multi-device chassis 202 may be synchronized, and each of the computing devices 500 in the multi-device chassis 202 may be provided with a predetermined air filter characterization time period. For example, a network administrator or other user may utilize a management device connected to any computing device 400/500 in the multi-device chassis 202 in order to provide a predetermined air filter characterization time period to that computing device 400/500. As such, with reference to FIG. 8, the air filter characterization engine 404 each of the computing devices 400/500 in the multi-device chassis 202 may perform predetermined air filter characterization time period receiving operations 800 that include receiving the predetermined air filter characterization time period via its communication system 410, and may then perform predetermined air filter characterization time period storage operations 802 that include storing the predetermined air filter characterization time period in its air filter characterization database 406.

In a specific example, the predetermined air filter characterization time period may be a repeating daily time period (e.g., between 12:00 am and 12:01 am each day), a repeating weekly time period (e.g., between 12:00 am and 12:01 am on Saturday each week), and/or any other repeating time periods that would be apparent to one of skill in the art in possession of the present disclosure. However, while repeating time periods are described, one of skill in the art in possession of the present disclosure will appreciate how the predetermined air filter characterization time period may be "scheduled" or otherwise provided for each of the computing devices in a multi-device chassis in other manners that will fall within the scope of the present disclosure as well.

Furthermore, in embodiments in which multiple multi-device chassis (each storing multiple computing devices) are provided (e.g., in a datacenter or other multi-device chassis location), respective predetermined air filter characterization time periods for computing devices in different multi-device chassis may be "staggered" such that first computing devices in a first multi-device chassis are provided a first predetermined air filter characterization time period (e.g., between 12:00 am and 12:01 am each day), second computing devices in a second multi-device chassis are provided a second predetermined air filter characterization time period (e.g., between 1:00 am and 1:01 am each day), third computing devices in a third multi-device chassis are provided a third predetermined air filter characterization time period (e.g., between 2:00 am and 2:01 am each day), and so on. As will be appreciated by one of skill in the art in possession of the present disclosure, such "staggered" predetermined air filter characterization time periods for computing devices in different multi-device chassis may reduce power consumption issues, noise issues, and/or other issues that may otherwise result if the same predetermined air filter characterization time period is utilized across different multi-device chassis at the same location. However, while particular techniques for providing particular predetermined air filter characterization time periods in computing devices in a multi-device chassis have been described, one of skill in the art in possession of the present disclosure will appreciate how other predetermined air filter characterization time periods may be provided in computing devices in a multi-device chassis using other techniques while remaining with the scope of the present disclosure as well.

In an embodiment, at decision block 602, the air filter characterization engine 404 in each of the computing devices 400/500 in the multi-device chassis system 200 may operate to determine (e.g., using its respective clock that was synchronized with the clocks in each of the other computing devices in the multi-device chassis system 200) whether a current time corresponds to the predetermined air filter characterization time period stored in its air filter characterization database 406. Using the specific example where the predetermined air filter characterization time period is a repeating daily time period between 12:00 am and 12:01 am each day, at decision block 602 the air filter characterization engine 404 in each of the computing devices 400/500 in the multi-device chassis system 200 may operate to determine whether a current time is 12:00 am. As will be appreciated by one of skill in the art in possession of the present disclosure, the synchronization of the clocks in the computing devices 500 will configure each of the computing devices 500 in the multi-device chassis 202 to determine when the predetermined air filter characterization time period begins at the same time.

If, at decision block 602, it is determined that the current time does not correspond to the predetermined air filter characterization time period, the method 600 returns to decision block 602. As such, the method 600 may loop such that the air filter characterization engine 404 in each of the computing devices 400/500 in the multi-device chassis system 200 monitors for the predetermined air filter characterization time period to begin, and one of skill in the art in possession of the present disclosure will appreciate how each of the computing devices 400/500 in the multi-device chassis system 200 may utilize their respective cooling systems in conventional manners to cool their components while monitoring for the predetermined air filter characterization time period to begin.

Figure 9:
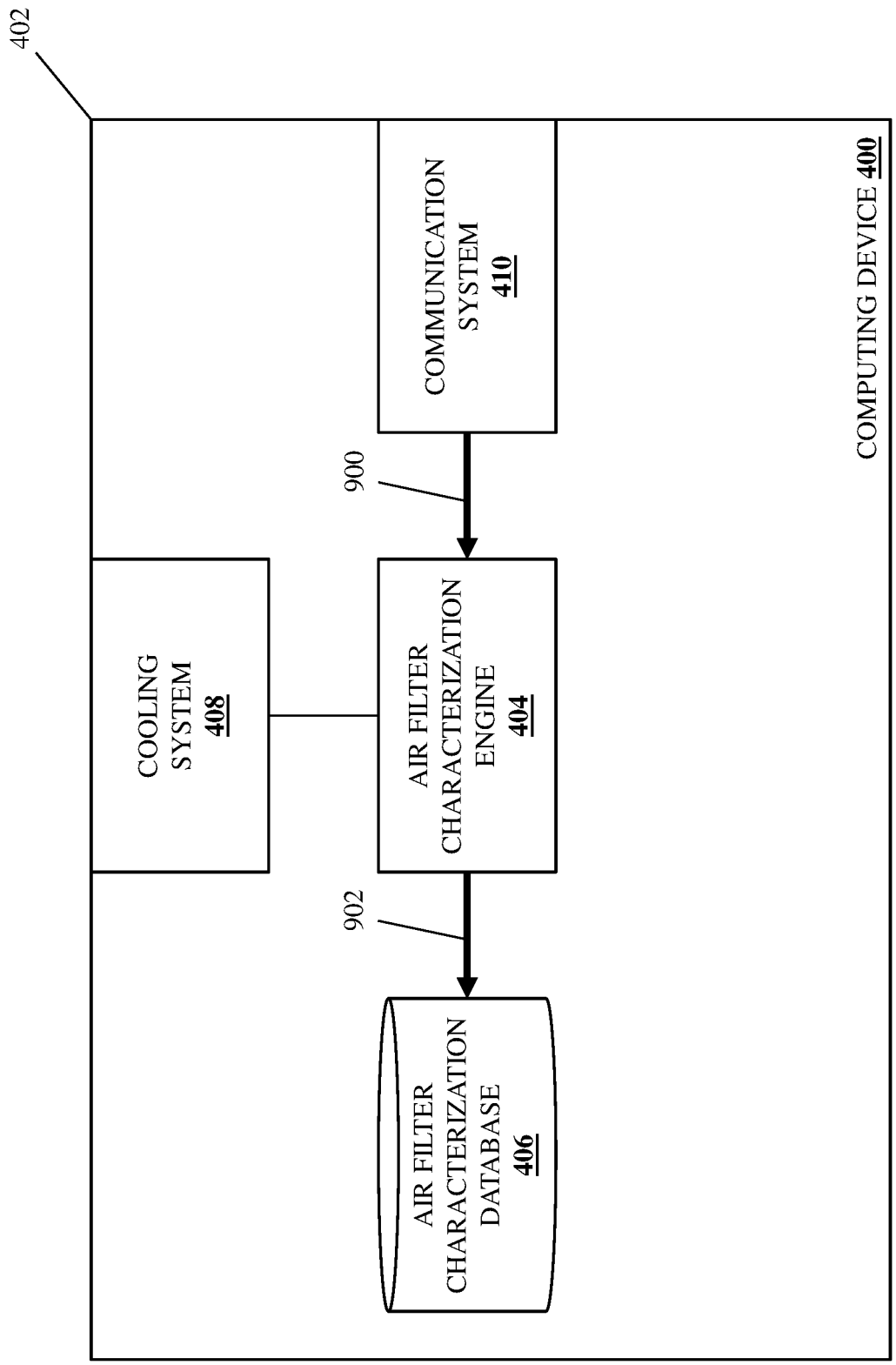
FIG. 9 is a schematic view illustrating an embodiment of the operation of the computing device of FIG. 4 during the method of FIG. 6.

If at decision block 602, it is determined that the current time corresponds to the predetermined air filter characterization time period, the method 600 proceeds to block 604 where the computing devices in the multi-device chassis operate their respective cooling systems at a predetermined cooling system operating level for the predetermined air filter characterization time period. In an embodiment, during or prior to the method 600, each of the computing devices 500 in the multi-device chassis 202 may be provided with a predetermined cooling system operating level. For example, a network administrator or other user may utilize a management device connected to any computing device 400/500 in the multi-device chassis 202 in order to provide a predetermined cooling system operating level to that computing device 400/500. As such, with reference to FIG. 9, the air filter characterization engine 404 each of the computing devices 500 in the multi-device chassis 202 may perform predetermined cooling system operating level receiving operations 900 that include receiving the predetermined cooling system operating level via its communication system 410, and may then perform predetermined cooling system operating level storage operations 902 that include storing the predetermined cooling system operating level in its air filter characterization database 406.

In a specific example, the predetermined cooling system operating level may be a relatively high cooling system operating level. For example, in embodiments in which the cooling systems 408 in the computing devices 400/500 in the multi-device chassis 202 are provided by fan systems, the predetermined cooling system operating level may be a predetermined fan system operating level of greater than 90% fan system capability of the fan systems. As will be appreciated by one of skill in the art in possession of the present disclosure, a fan system operating level of 100% fan system capability of the fan systems may result in the highest pressure drop produced by the air filter in the air filter system 210, and thus may provide the greatest air filter test sensitivity. However, while a particular predetermined cooling system operating level and/or operating level range is described, one of skill in the art in possession of the present disclosure will appreciate how any of a variety of predetermined cooling system operating levels will fall within the scope of the present disclosure as well, with any one of those predetermined cooling system operating levels utilized by each of the computing devices 400/500 in the multi-device chassis 202 during the predetermined air filter characterization time period.

Figure 10:
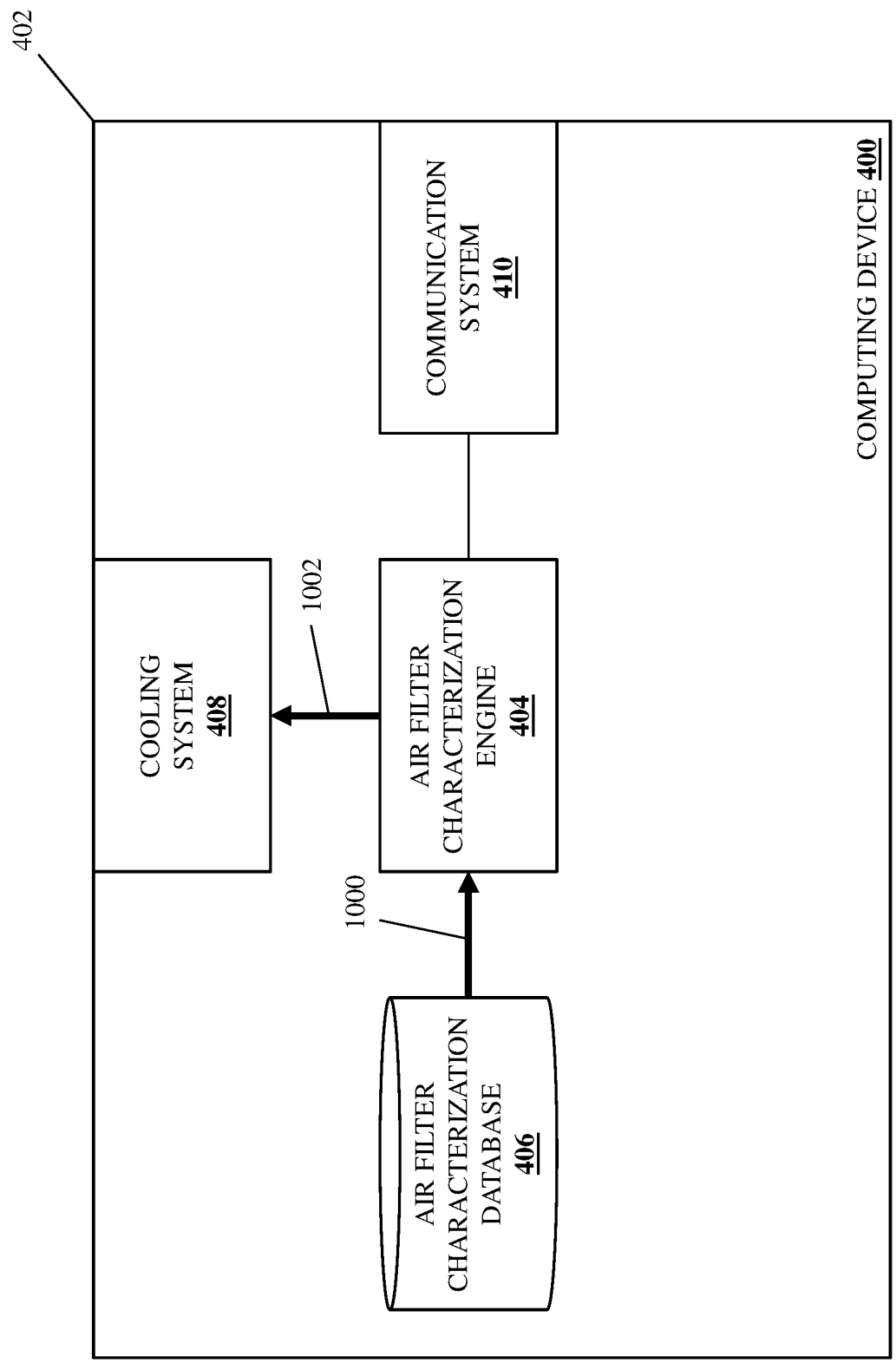
FIG. 10 is a schematic view illustrating an embodiment of the operation of the computing device of FIG. 4 during the method of FIG. 6.
Figure 11:
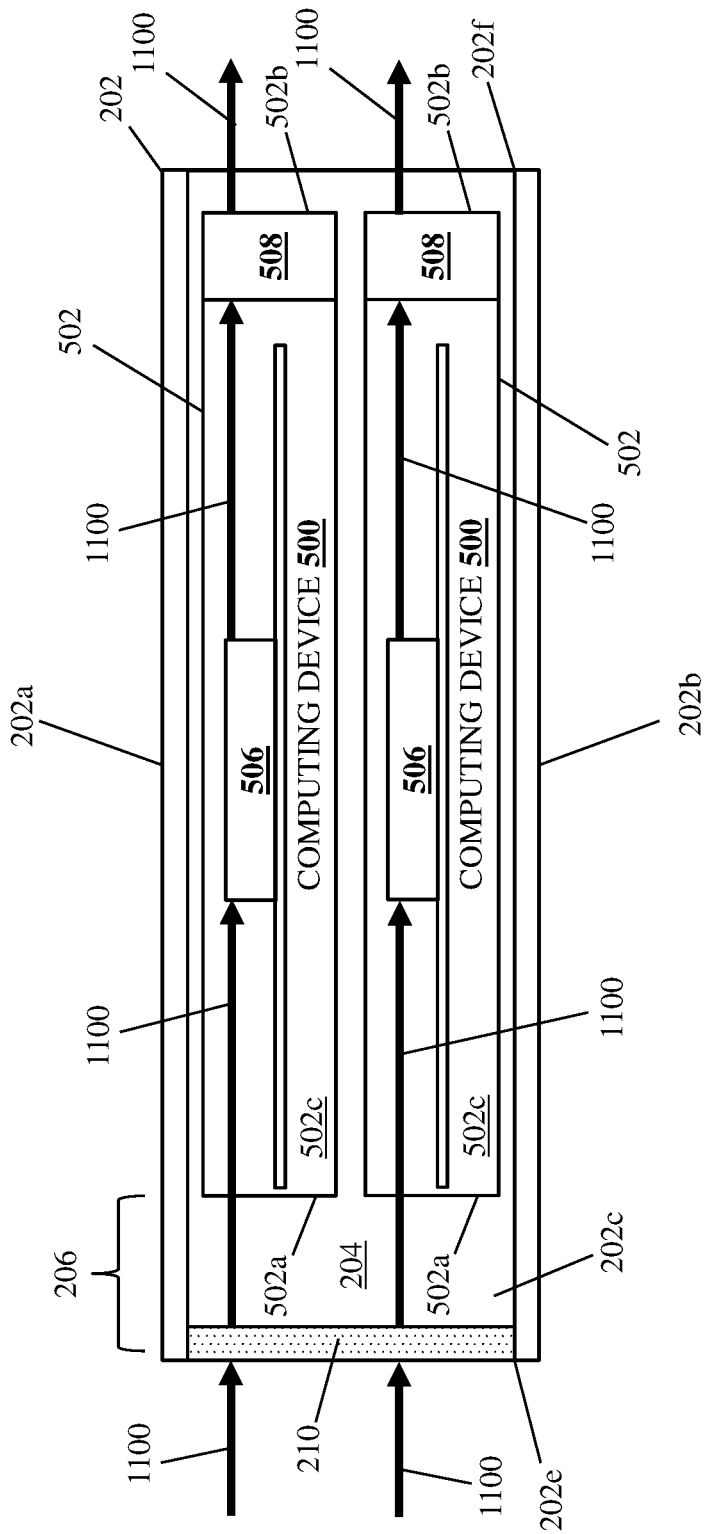
FIG. 11 is a schematic view illustrating an embodiment of the operation of the computing devices of FIG. 7 during the method of FIG. 6.

With reference to FIG. 10, in an embodiment of block 604 and in response to determining that the current time corresponds to the predetermined air filter characterization time period, the air filter characterization engine 404 in each computing device 400/500 in the multi-device chassis 202 may perform predetermined cooling system operating level retrieval operations 1000 that include retrieving the predetermined cooling system operating level from its air filter characterization database 406, and cooling system activation operations 1002 in order to operate their cooling system 408 at the predetermined cooling system operating level for the predetermined air filter characterization time period. Continuing with the specific examples above in which the cooling systems 408 in the computing devices 400/500 in the multi-device chassis 202 are provided by fan systems, the cooling system activation operations 1002 may provide for the operation of the fan systems in each computing device 400/500 in the multi-device chassis 202 at 100% fan system capability of those fan systems from 12:00 am to 12:01 am. With reference to FIG. 11, the operation of the cooling systems 408 in the computing devices 400/500 in the multi-device chassis 202 at block 604 will generate a respective airflow 1100 that enters the front surface 502a, moves through the computing device housing 502c, and exist the rear surface 502b on the chassis 502 of that computing device 400/500.

The method 600 then proceeds to block 606 where a first computing device in the multi-device chassis measures a test air filtering characteristic provided by an air filter on the multi-device chassis during the predetermined air filter characterization time period. As will be appreciated by one of skill in the art in possession of the present disclosure, at least one the computing devices 500 in the multi-device chassis 202 may be configured to measure one or more air filter characteristics provided by the air filter in the air filter system 210 during the predetermined air filter characterization time period, and while a single "air filter test manager" computing device is described below as performing this functionality, multiple air filter test manager computing devices will fall within the scope of the present disclosure as well. For example, the multi-device chassis 202 may include one or more air filter sensor devices (not illustrated), and the air filter characterization engine 404 in the air filter test manager computing device 500 in the multi-device chassis 202 may be coupled to the air filter sensor device(s) (e.g., via cabling, wirelessly, etc.) and may be configured to measure air filtering characteristic(s) provided by the air filter in the air filter system 210 using those air filter sensor device(s).

To provide a specific example, the air filter sensor device(s) on the multi-device chassis 202 may include a first pressure sensor device that is configured to identify a first pressure (e.g., of the airflow 1100) outside the multi-device chassis 202 and opposite the air filter system 210 from the multi-device chassis housing 204, and a second pressure sensor device that is configured to identify a second pressure (e.g., of the airflow 1100) within the multi-device chassis housing 204 of the multi-device chassis 202 (e.g., immediately adjacent the air filter system 210). As such, in this specific example, the air filter characterization engine 404 in the air filter test manager computing device 400/500 in the multi-device chassis 200 may be coupled to the first and second pressure sensor devices (e.g., via its communication system 410 using cabling, wireless communications, etc.).

Figure 12:
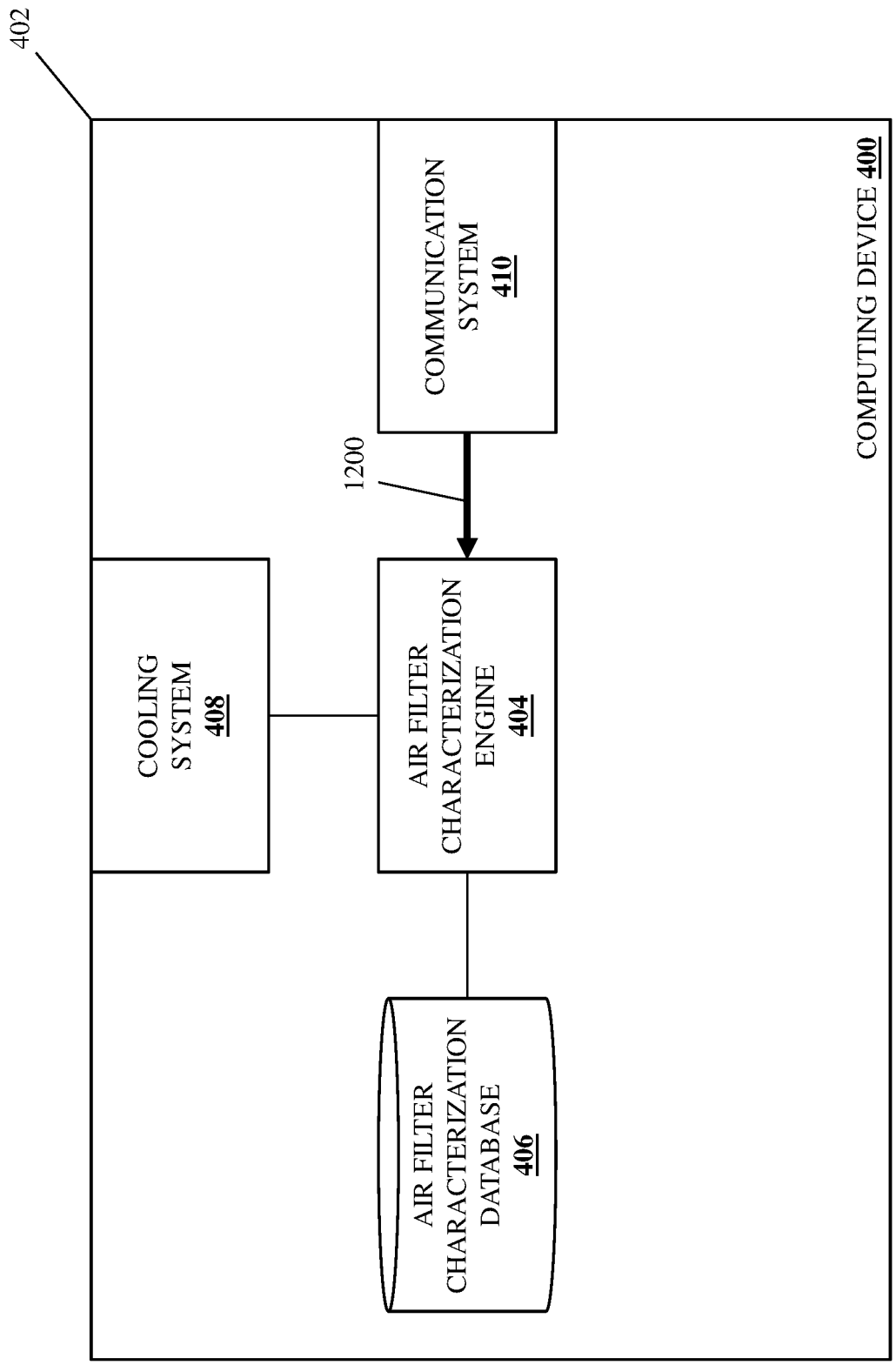
FIG. 12 is a schematic view illustrating an embodiment of the operation of the computing device of FIG. 4 during the method of FIG. 6.

With reference to FIG. 12, in an embodiment of block 606, the air filter characterization engine 404 in the air filter test manager computing device 400/500 in the multi-device chassis 200 may perform air filtering characteristic measurement operations 1200 that include receiving the first pressure and the second pressure identified by the first and second pressure sensor devices via its communication system 410, and determining a test air filtering characteristic produced by the air filter in the air filter system 210 that includes a differential pressure that is provided by a difference between the first pressure and the second pressure. However, while particular air filter sensor devices utilized to provide a particular test air filtering characteristic are described, one of skill in the art in possession of the present disclosure will appreciate how other test air filtering characteristics produced by the air filter in the air filter system 210 may be measured by the air filter characterization engine 404 in the air filter test manager computing device 400/500 in the multi-device chassis 200 at block 606 while remaining within the scope of the present disclosure as well.

The method 600 then proceeds to decision block 608 where the first computing device determines whether the air filter was provided on the multi-device chassis subsequent to a most recent predetermined air filter characterization time period. As discussed herein, air filter(s) in the air filter system 210 provided on the multi-device chassis 202 may be periodically replaced based on the teachings of the present disclosure, and the provisioning of a "new" air filter in the air filter system 210 provided on the multi-device chassis 202 may be accompanied by the generation of reference air filtering characteristic(s) for that "new" air filter. As such, in an embodiment of decision block 608, the air filter characterization engine 404 in the air filter test manager computing device 400/500 may determine whether the air filter in the air filter system 210 was provided on the multi-device chassis 202 subsequent to a most recent predetermined air filter characterization time period (e.g., subsequent to 12:01 am on the previous day using the specific example provided above), and/or is otherwise a "new" air filter (e.g., an air filter that has not been used before, an air filter that has been cleaned, etc.).

Figure 13:
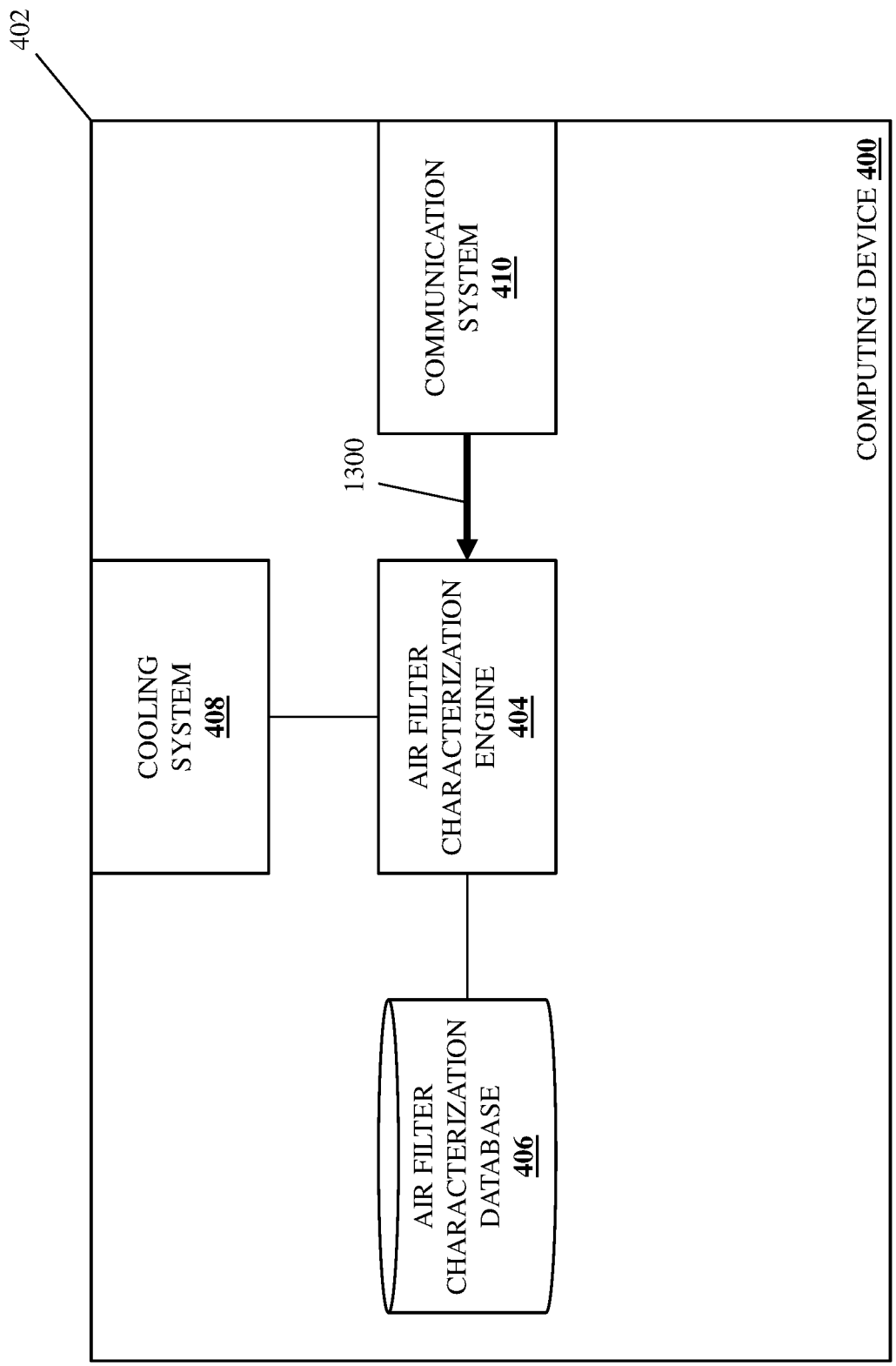
FIG. 13 is a schematic view illustrating an embodiment of the operation of the computing device of FIG. 4 during the method of FIG. 6.

In some embodiments, a network administrator or other user may indicate that an air filter in the air filter system 210 is a "new" air filter that was provided on the multi-device chassis 202 subsequent to a most recent predetermined air filter characterization time period by activating an air filter replacement indicator (e.g., a button or other indicator that would be apparent to one of skill in the art in possession of the present disclosure) on the multi-device chassis 202 or the air filter test manager computing device 500. As such, with reference to FIG. 13, at decision block 608 the air filter characterization engine 404 in the air filter test manager computing device 400/500 in the multi-device chassis 200 may perform air filter determination operations 1300 via its communication system 410 to access the air filter replacement indicator and determine whether it has been activated in order to determine whether the air filter in the air filter system 210 is a "new" air filter.

In other embodiments, a network administrator or other user may indicate that an air filter in the air filter system 210 is a "new" air filter that was provided on the multi-device chassis 202 subsequent to a most recent predetermined air filter characterization time period via a remote access controller device in the air filter test manager computing device 500 (e.g., an integrated DELL® Remote Access Controller (iDRAC) available in computing devices provided by DELL® Inc. of Round Rock, Texas United States, a Baseboard Management Controller (BMC), and/or other remote access controller devices known in the art), and thus the air filter characterization engine 404 in the air filter test manager computing device 400/500 in the multi-device chassis 200 may access its remote access controller device at decision block 608 and determine whether the air filter in the air filter system 210 is a "new" air filter. However, while a few specific examples have been provided, one of skill in the art in possession of the present disclosure will appreciate that the determination of whether an air filter in the air filter system 210 was provided on the multi-device chassis 202 subsequent to a most recent predetermined air filter characterization time period, and/or is otherwise a "new" air filter, may be performed using other techniques that will fall within the scope of the present disclosure as well.

Figure 14:
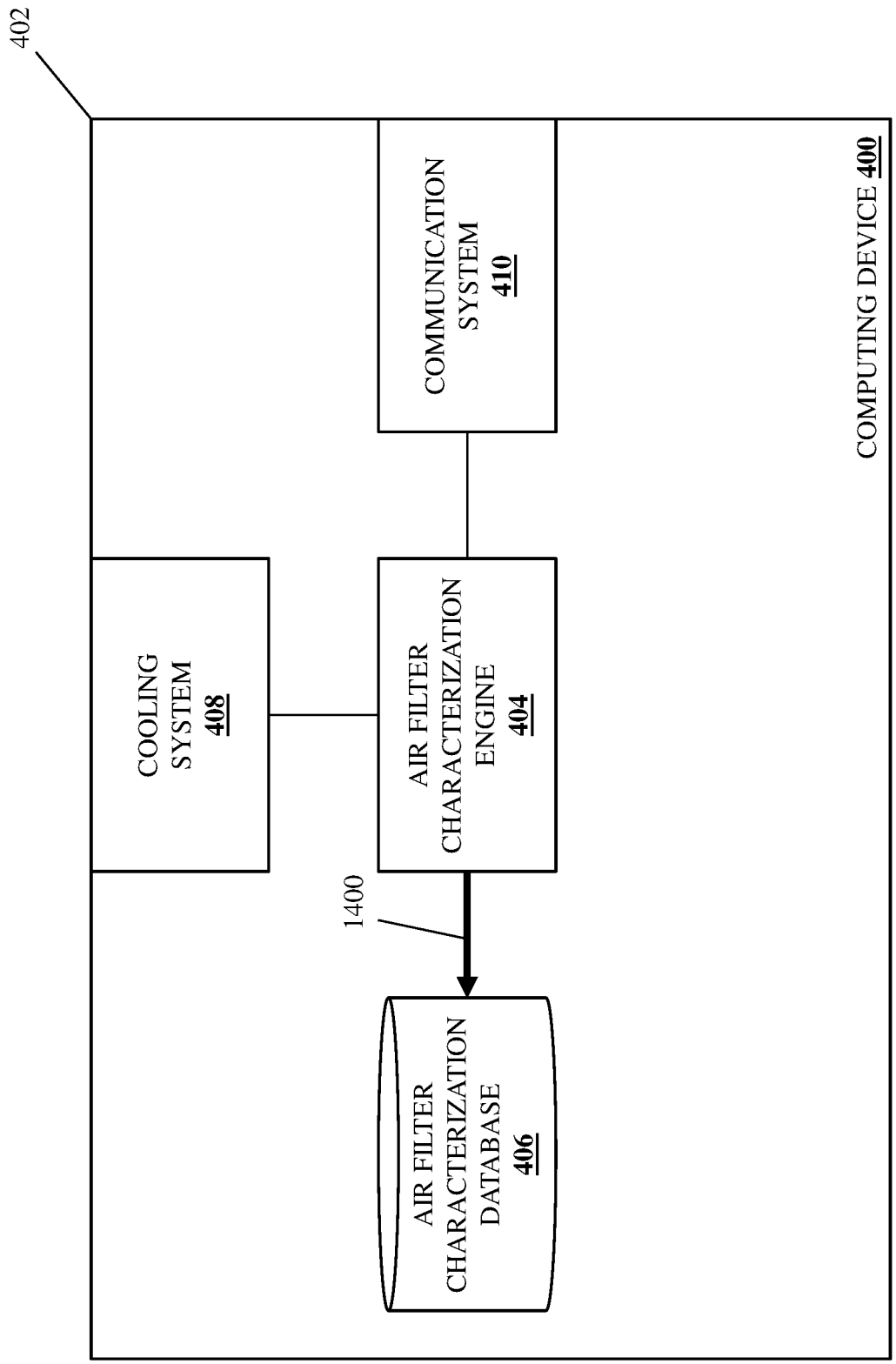
FIG. 14 is a schematic view illustrating an embodiment of the operation of the computing device of FIG. 4 during the method of FIG. 6.

If, at decision block 608, it is determined that the air filter was provided on the multi-device chassis subsequent to a most recent predetermined air filter characterization time period, the method 600 proceed to block 610 where the first computing device stores the test air filter characteristic as a reference air filter characteristic. With reference to FIG. 14, in an embodiment of block 610, the air filter characterization engine 404 in the air filter test manager computing device 400/500 in the multi-device chassis 200 may perform reference air filter characteristic storage operations 1400 that include storing the test air filter characteristic measured at block 606 as a reference air filter characteristic in the air filter characterization database 406. As such, one of skill in the art in possession of the present disclosure will appreciate how air filters in the air filter system 210 provided in the multi-device chassis 202 may be replaced subsequent to a predetermined air filter characterization time period, and the air filtering characteristic(s) provided by that air filter may then be measured in an immediately subsequent predetermined air filter characterization time period and stored in the air filter characterization database 406 as a reference air filtering characteristic(s).

However, while the determination of reference air filter characteristics for air filters in the predetermined air filter characterization time period that immediately follows their provisioning in a multi-device chassis is described, determination of reference air filter characteristics for air filters in other predetermined air filter characterization time periods that may not immediately follows their provisioning in a multi-device chassis will fall within the scope of the present disclosure as well. For example, a network administrator or other user may replace an air filter in an air filter system on a multi-device chassis and forgot or otherwise neglect to immediately identify the "new" air filter as discussed above, and one of skill in the art in possession of the present disclosure will appreciate how the techniques described herein will still provide benefits if that "new" air filter is identified as discussed above one or more predetermined air filter characterization time periods following its provisioning in the multi-device chassis (with more benefits being realized the sooner that "new" air filter is identified). The method then returns to decision block 602.

Figure 15:
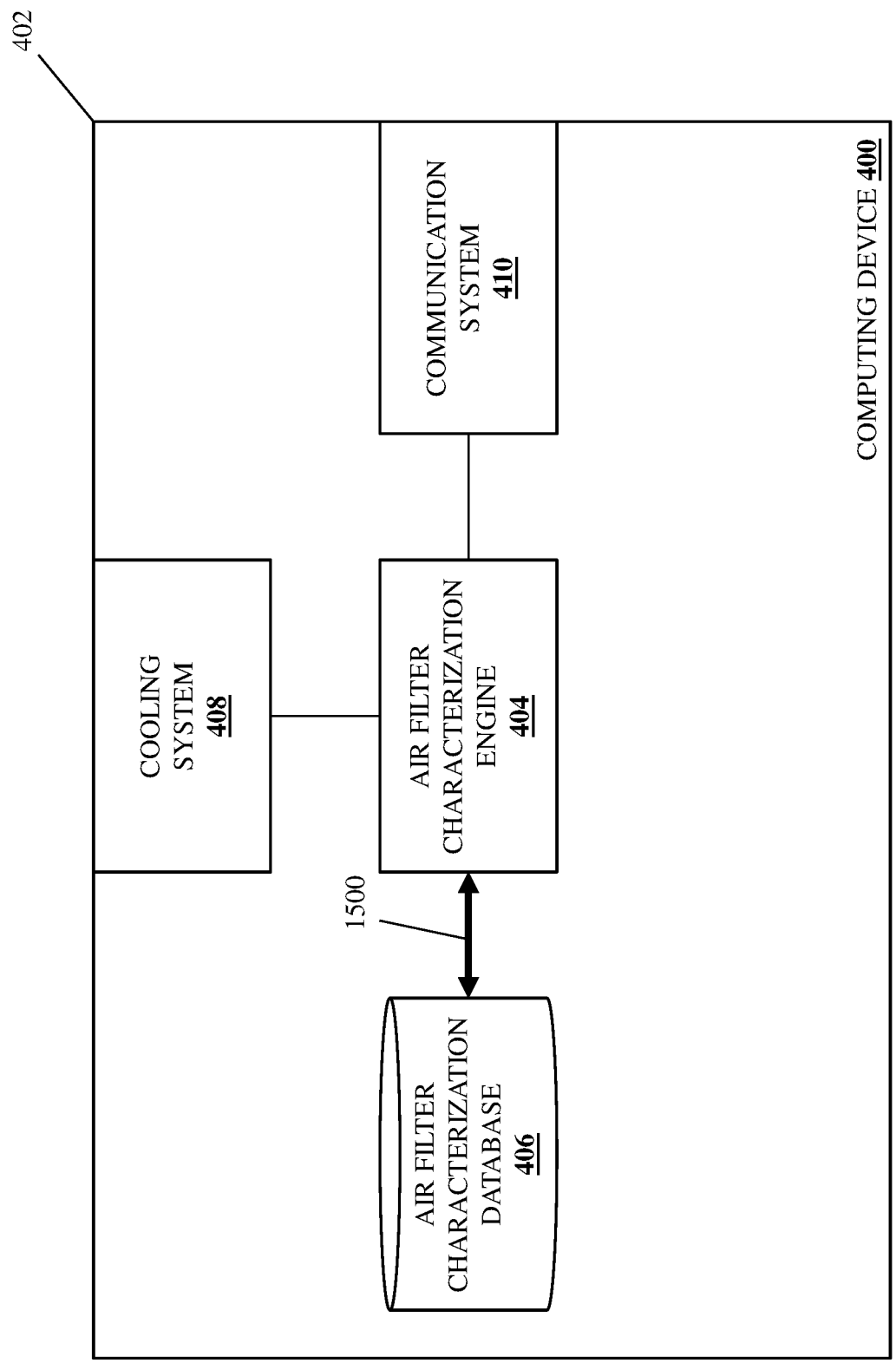
FIG. 15 is a schematic view illustrating an embodiment of the operation of the computing device of FIG. 4 during the method of FIG. 6.

If, at decision block 608, it is determined that the air filter was not provided on the multi-device chassis subsequent to a most recent predetermined air filter characterization time period, the method 600 proceeds to decision block 612 where the first computing device determines whether a difference between the test air filter characteristic and a reference air filter characteristics exceeds a threshold. With reference to FIG. 15, in an embodiment of decision block 612, the air filter characterization engine 404 in the air filter test manager computing device 400/500 in the multi-device chassis 200 may perform test/reference air filter characteristic difference determination operations 1500 that may include retrieving a reference air filtering characteristic from the air filter characterization database 406, and comparing the test air filtering characteristic measured at block 606 to that reference air filtering characteristic to determine whether a difference between the two exceeds a threshold.

For example, as discussed above, an iteration of the method 600 immediately following the provisioning of an air filter in the air filter system 210 on the multi-device chassis 202 may include the determination and storage of a reference air filtering characteristic for that air filter. Subsequent iterations of the method 600 may then determine respective test air filtering characteristics for that air filter in the air filter system 210 on the multi-device chassis 202, and one of skill in the art in possession of the present disclosure will appreciate how the operation of the cooling systems 408/fan systems 508 in the computing devices 400/500 in the multi-device chassis 202 to cool the components included therein provides the airflow 1100 through that air filter in the air filter system 210 on the multi-device chassis 202 illustrated in FIG. 11 that will result in that air filter filtering particulate matter out of the air that moves through it. As such, the test air filtering characteristic of the air filter in the air filter system 210 on the multi-device chassis 202 will be different from the reference air filtering characteristic previously measured for that air filter.

Continuing with the specific example provided above, the reference differential pressure produced by the air filter in the air filter system 210 on the multi-device chassis 202 will be lower than the test differential pressure produced by that air filter due to, for example, the particulate matter collected by that air filter creating a larger pressure drop across that air filter than existed before it has collected that particulate matter (i.e., due to some level of "clogging" of that air filter). As such, at decision block 612, the air filter characterization engine 404 in the air filter test manager computing device 400/500 in the multi-device chassis 200 may determine whether test differential pressure that provides the test air filtering characteristic differs from the reference differential pressure that provides the reference air filtering characteristic by more than a threshold. In different embodiments, the threshold may be hard coded in the air filter test manager computing device 400/500, calculated by the air filter test manager computing device 400/500, selected by the air filter test manager computing device 400/500 from a table based on a configuration of the multi-device chassis system 200, and/or identified in a variety of other manners that would be apparent to one of skill in the art in possession of the present disclosure. To provide a specific example, the threshold utilized at decision block 612 may be exceeded when the test differential pressure ($T_{dp}$) is greater than 1.3 times the reference differential pressure ($R_{dp}$) (i.e., $T_{dp}/R_{dp}>1.3$). However, while a specific example of threshold is provided herein, one of skill in the art in possession of the present disclosure will appreciate how the air filter replacement alert may be generated at any of a variety of threshold values while remaining within the scope of the present disclosure as well.

If, at decision block 612, it is determined that the difference between the test air filter characteristic and the reference air filter characteristics does not exceed a threshold, the method 600 returns to decision block 602. As such, the method 600 may loop such that the computing devices 400/500 in the multi-device chassis 202 operate their cooling systems 408 at the predetermined cooling system operating level for the predetermined air filter characterization time period while the air filter test manager computing device 400/500 in the multi-device chassis 200 continues to measure test air filtering characteristics provided by the air filter in the air filter system 210 on the multi-device chassis 202 until a difference between a test air filtering characteristic and the reference air filter characteristic exceeds the threshold and/or that air filter is replaced.

Figure 16:
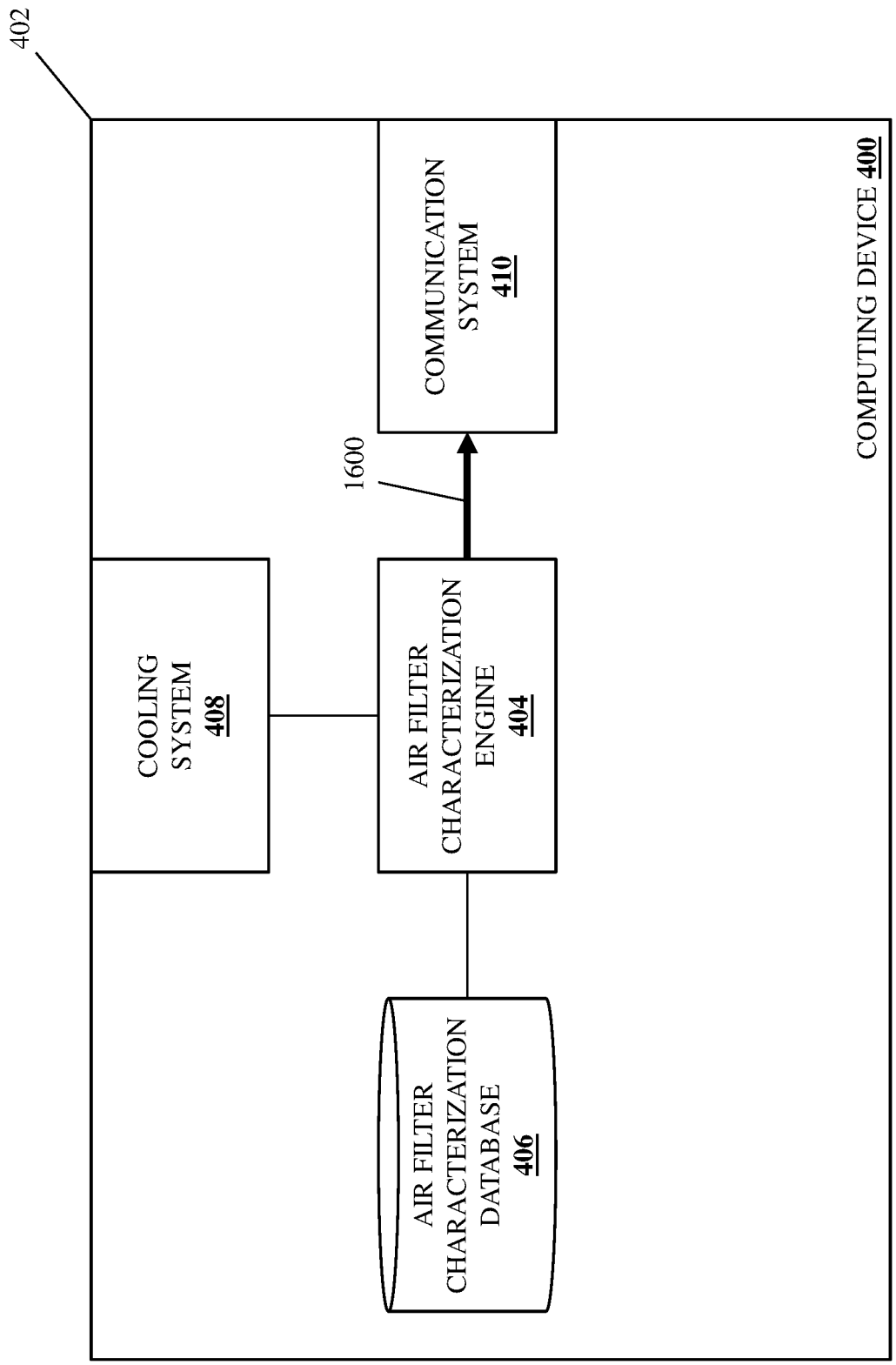
FIG. 16 is a schematic view illustrating an embodiment of the operation of the computing device of FIG. 4 during the method of FIG. 6.

If, at decision block 612, it is determined that the difference between the test air filter characteristic and the reference air filter characteristics exceeds a threshold, the method 600 proceeds to block 614 where the first computing device generates an air filter replacement alert. With reference to FIG. 16, in an embodiment of block 614 and in response to determining that the difference between the test air filtering characteristic and the reference air filter characteristic exceeds the threshold at decision block 612, the air filter characterization engine 404 in the air filter test manager computing device 400/500 in the multi-device chassis 200 may perform air filter replacement alert generation operations 1600 that include generating an air filter replacement alert and transmitting that air filter replacement alert via the communication system 410. As will be appreciated by one of skill in the art in possession of the present disclosure, the air filter replacement alert may include any air filter replacement information known in the art for indicating or identifying the need to replace an air filter in a multi-device chassis, and may be transmitted in any manner (e.g., directly, via a network, etc.) to any device (e.g., a management device) while remaining within the scope of the present disclosure. One of skill in the art in possession of the present disclosure will recognize that a network administrator or other user receiving such an air filter replacement alert may then replace the existing air filter in the multi-device chassis 202 with a "new" air filter similarly as described above.

Thus, systems and methods have been described that provide for the coordination of the operation of cooling systems in independent computing devices that share a multi-device chassis at a predetermined operating level during a predetermined air filter characterization period so that one of the computing devices may measure air filtering characteristics provided by an air filter on the multi-device chassis in order to determine whether that air filter should be replaced. For example, the multi-device chassis air filter characterization system of the present disclosure may include a multi-device chassis, an air filter that is included on the multi-device chassis, and a plurality of computing devices that are housed in the multi-device chassis. Each of the computing devices determines that a current time corresponds to a predetermined air filter characterization time period and, in response, operates a cooling system in that computing device at a predetermined cooling system operating level for the predetermined air filter characterization time period. A first computing device that is included in the plurality of computing devices measures an air filtering characteristic provided by the air filter during the predetermined air filter characterization time period and, based on the air filtering characteristic, determines whether to generate an air filter replacement alert. As such, accurate determinations of a reference air filtering characteristic and test air filtering characteristics may be made in order to allow accurate characterization of an air filter on a multi-device chassis that houses independent computing devices, which each control the operation of each of their cooling systems separately, in order to determine whether that air filter should be replaced.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-device chassis air filter characterization system, comprising:
    a multi-device chassis;
    an air filter that is included on the multi-device chassis;
    a plurality of computing devices that are housed in the multi-device chassis, wherein each of the plurality of computing devices is configured to:
        determine that a current time corresponds to a predetermined air filter characterization time period; and
        operate, in response to determining that the current time corresponds to the predetermined air filter characterization time period, a cooling system in that computing device at a predetermined cooling system operating level for the predetermined air filter characterization time period,
    wherein a first computing device that is included in the plurality of computing devices is configured to:
        measure an air filtering characteristic provided by the air filter during the predetermined air filter characterization time period; and
        determine, based on the air filtering characteristic, whether to generate an air filter replacement alert.

2. The system of claim 1, wherein the first computing device is configured to:
    measure a first air filtering characteristic provided by the air filter during a first predetermined air filter characterization time period;
    determine that the air filter was provided in the multi-device chassis subsequent to a most recent predetermined air filter characterization time period that was the most recent predetermined air filter characterization time period prior to the first predetermined air filter characterization time period; and
    store, in response to determining that the air filter was provided in the multi-device chassis subsequent to the most recent predetermined air filter characterization time period, the first air filtering characteristic in a database.

3. The system of claim 2, wherein the first computing device is configured to:
    measure a second air filtering characteristic of the air filter during a second predetermined air filter characterization time period that is the predetermined air filter characterization time period immediately subsequent to the first predetermined air filter characterization time period; and
    determine whether a difference between the second air filtering characteristic and the first air filtering characteristic exceeds a threshold to determine whether to generate the air filter replacement alert.

4. The system of claim 3, wherein the first computing device is configured to:
    generate, in response to determining that the difference between the second air filtering characteristic and the first air filtering characteristic exceeds the threshold, the air filter replacement alert.

5. The system of claim 1, wherein the air filtering characteristic includes a pressure difference provided by the air filter.

6. The system of claim 1, wherein the respective cooling system in each computing device includes a fan system.

7. The system of claim 6, wherein the predetermined cooling system operating level is a predetermined fan system operating level of greater than 90% fan system capability.

8. An Information Handling System (IHS), comprising:
    a processing system; and
    a memory system that is coupled to the processing system and that includes instructions that, when executed by the processing system, cause the processing system to:
        determine that a current time corresponds to a predetermined air filter characterization time period;
        operate, in response to determining that the current time corresponds to the predetermined air filter characterization time period and at a predetermined cooling system operating level for the predetermined air filter characterization time period, a first cooling system that is included in a first Information Handling System (IHS) chassis with the processing system;
        measure, during the predetermined air filter characterization time period, an air filtering characteristic that is provided by an air filter on a multi-device chassis that houses the first IHS chassis in response to 1) the operation of the first cooling system at the predetermined cooling system operating level during the predetermined air filter characterization time period, and 2) operation of a respective second cooling system included in each of at least one second IHS chassis that is housed in the multi-device chassis at the predetermined cooling system operating level for the predetermined air filter characterization time period; and
        determine, based on the air filtering characteristic, whether to generate an air filter replacement alert.

9. The IHS of claim 8, wherein the instructions on the memory system, when executed by the processing system, cause the processing system to:
    measure a first air filtering characteristic provided by the air filter during a first predetermined air filter characterization time period;
    determine that the air filter was provided in the multi-device chassis subsequent to a most recent predetermined air filter characterization time period that was the most recent predetermined air filter characterization time period prior to the first predetermined air filter characterization time period; and
    store, in response to determining that the air filter was provided in the multi-device chassis subsequent to the most recent predetermined air filter characterization time period, the first air filtering characteristic in a database.

10. The IHS of claim 9, wherein the instructions on the memory system, when executed by the processing system, cause the processing system to:
    measure a second air filtering characteristic of the air filter during a second predetermined air filter characterization time period that is the predetermined air filter characterization time period immediately subsequent to the first predetermined air filter characterization time period; and
    determine whether a difference between the second air filtering characteristic and the first air filtering characteristic exceeds a threshold to determine whether to generate the air filter replacement alert.

11. The IHS of claim 10, wherein the instructions on the memory system, when executed by the processing system, cause the processing system to:

generate, in response to determining that the difference between the second air filtering characteristic and the first air filtering characteristic exceeds the threshold, the air filter replacement alert.

12. The IHS of claim 8, wherein the air filtering characteristic includes a pressure difference provided by the air filter.

13. The IHS of claim 8, wherein the respective cooling system in each computing device includes a fan system, and wherein the predetermined cooling system operating level is a predetermined fan system operating level of greater than 90% fan system capability.

14. A method for multi-device chassis air filter characterization, comprising:
    determining, by each of a plurality of computing devices that are housed in a multi-device chassis, that a current time corresponds to a predetermined air filter characterization time period; and
    operating, by each of the plurality of computing devices that are housed in the multi-device chassis in response to determining that the current time corresponds to the predetermined air filter characterization time period, a cooling system in that computing device at a predetermined cooling system operating level for the predetermined air filter characterization time period;
    measuring, by a first computing device that is included in the plurality of computing devices, an air filtering characteristic provided by the air filter during the predetermined air filter characterization time period; and
    determining, by the first computing device that is included in the plurality of computing devices based on the air filtering characteristic, whether to generate an air filter replacement alert.

15. The method of claim 14, further comprising:
    measuring, by the first computing device that is included in the plurality of computing devices, a first air filtering characteristic provided by the air filter during a first predetermined air filter characterization time period;
    determining, by the first computing device that is included in the plurality of computing devices, that the air filter was provided in the multi-device chassis subsequent to a most recent predetermined air filter characterization time period that was the most recent predetermined air filter characterization time period prior to the first predetermined air filter characterization time period; and
    storing, by the first computing device that is included in the plurality of computing devices in response to determining that the air filter was provided in the multi-device chassis subsequent to the most recent predetermined air filter characterization time period, the first air filtering characteristic in a database.

16. The method of claim 15, further comprising:
    measuring, by the first computing device that is included in the plurality of computing devices, a second air filtering characteristic of the air filter during a second predetermined air filter characterization time period that is the predetermined air filter characterization time period immediately subsequent to the first predetermined air filter characterization time period; and
    determining, by the first computing device that is included in the plurality of computing devices, whether a difference between the second air filtering characteristic and the first air filtering characteristic exceeds a threshold to determine whether to generate the air filter replacement alert.

17. The method of claim 16, further comprising:
    generating, by the first computing device that is included in the plurality of computing devices in response to determining that the difference between the second air filtering characteristic and the first air filtering characteristic exceeds the threshold, the air filter replacement alert.

18. The method of claim 14, wherein the air filtering characteristic includes a pressure difference provided by the air filter.

19. The method of claim 14, wherein the respective cooling system in each computing device includes a fan system.

20. The method of claim 19, wherein the predetermined cooling system operating level is a predetermined fan system operating level of greater than 90% fan system capability.

* * * * *